United States Patent [19]
Yoshida et al.

[11] Patent Number: 5,500,381
[45] Date of Patent: Mar. 19, 1996

[54] FABRICATION METHOD OF FIELD-EFFECT TRANSISTOR

[75] Inventors: Takayoshi Yoshida; Yasunobu Nashimoto, both of Tokyo, Japan

[73] Assignee: NEC Corporation, Tokyo, Japan

[21] Appl. No.: 413,616

[22] Filed: Mar. 30, 1995

[30] Foreign Application Priority Data

Mar. 30, 1994 [JP] Japan ................. 6-061692

[51] Int. Cl.⁶ .................... H01L 21/338
[52] U.S. Cl. .................. 437/41; 437/44; 437/39; 437/133; 437/176; 437/912; 148/DIG. 100
[58] Field of Search .................... 437/41, 44, 39, 437/40, 912, 978, 126, 133, 175, 176; 148/DIG. 100

[56] References Cited

U.S. PATENT DOCUMENTS

| | | | |
|---|---|---|---|
| 4,525,919 | 7/1985 | Fabian | 437/176 |
| 5,006,478 | 4/1991 | Kobayashi et al. | 437/41 |
| 5,110,751 | 5/1992 | Nakagawa | 437/40 |
| 5,112,763 | 5/1992 | Taylor et al. | 148/DIG. 100 |
| 5,231,040 | 7/1993 | Shimura | 148/DIG. 100 |

FOREIGN PATENT DOCUMENTS 61-154177  7/1986  Japan .
3-145140   6/1991  Japan .

*Primary Examiner*—Tuan H. Nguyen
*Attorney, Agent, or Firm*—Burns, Doane, Swecker and Mathis

[57] ABSTRACT

A fabrication method of a FET that enables to realize a shorter length between a source-side edge of a recess and an opposing edge of a gate electrode at a higher accuracy than the accuracy limit of the present lithography technique, i.e., about ±0.1 μm. After channel, carrier-supply, and contact layers are epitaxially grown on a semiconductor substrate in this order, a patterned insulator layer is formed on the contact layer. Using the insulator layer as a mask, the contact layer is isotropically etched to form a symmetrical recess on the underlying carrier-supply layer. One of the ends of the contact layer facing the symmetrical recess is etched again to make it asymmetric. During the etching processes, the underlying carrier-supply layer is almost never etched due to large etch rate differences for the contact layer and the carrier-supply layer. A patterned conductor layer is formed on the patterned insulator layer to form the gate electrode in Schottky contact with the carrier-supply layer. After removing the insulator layer, and source and drain electrodes are formed on the contact layer. An etch-stop layer is additionally formed between the carrier-supply layer and the contact layer.

16 Claims, 15 Drawing Sheets

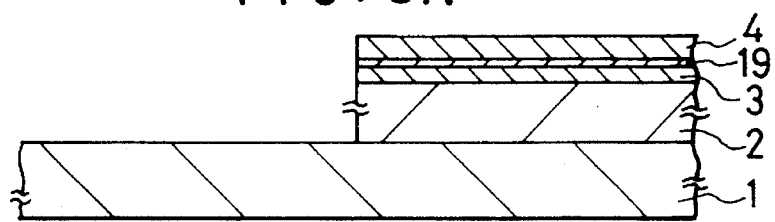
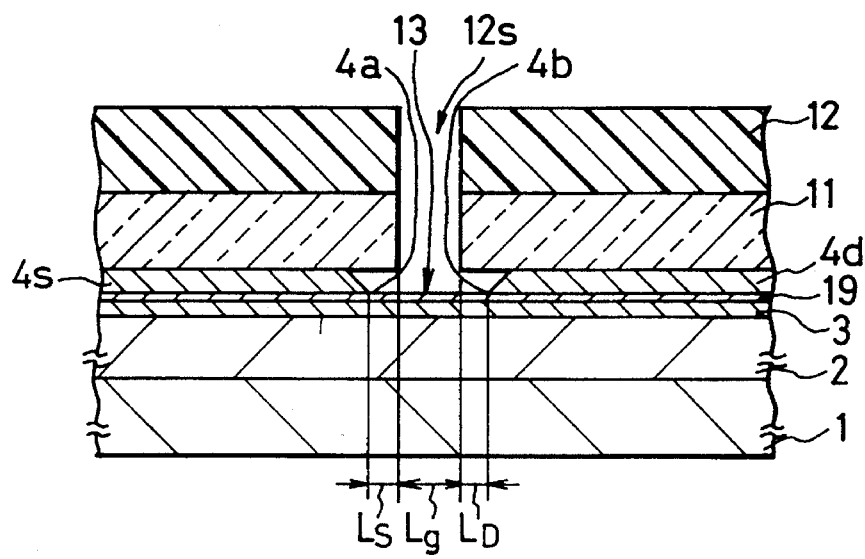
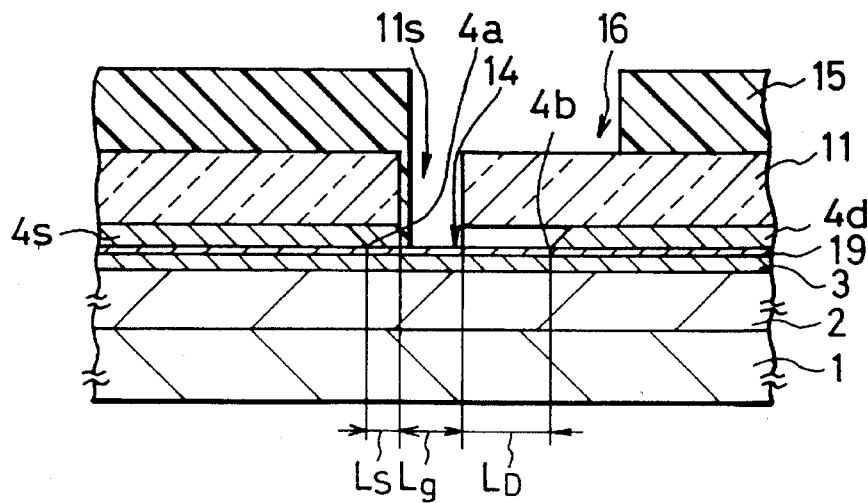

1

FABRICATION METHOD OF FIELD-EFFECT TRANSISTOR

BACKGROUND OF THE INVENTION

1. Field of the Invention

The present invention relates to a fabrication method of a field-effect transistor (FET) and more particularly, to a fabrication method of a compound semiconductor FET having an offset-gate electrode in a recess of a semiconductor layer, which enables to control separately a length between one edge of the recess and an opposed end of the gate electrode and a length between the other edge of the recess and the other opposed end of the gate electrode.

2. Description of the Prior Art

It has been known that a compound semiconductor heterojunction FET is superior in gain and noise to a silicon FET, that is, the former is higher in gain and lower in noise than the latter. Such the compound semiconductor FET contains a heterojunction of a first compound semiconductor (for example, AlGaAs) layer with a relatively lower electron affinity and a second compound semiconductor (for example, GaAs) layer with a relatively higher electron affinity.

With the first and second semiconductor layers of this FET, electrons as carriers within the first semiconductor layer tend to move into the second semiconductor layer to form an electron accumulation layer in the vicinity of the heterojunction inside the second semiconductor layer, resulting in a 2-dimension electron gas in the electron accumulation layer. A bias voltage applied to a gate electrode changes the electron density of the electron gas and as a result, the bias voltage can control a current flowing between a source electrode and a drain electrode disposed at each side of the gate electrode. The gate electrode is placed on the bottom of a recess formed between the source and drain electrodes.

The heterojunction FET of this type has already been put to practical use as a low noise device for the ultra-high frequency (UHF) band, which is especially proper for the 4 GHz band or higher.

With the heterojunction FET of this type, the series resistance $R_S$ between the source and drain electrodes is strongly dependent on the bottom length of the recess at the source side. Especially, in small current applications requiring sufficiently low noise characteristics, the electron density of the 2-dimension electron gas is limited to a low value at a position right below the gate electrode, and therefore, the series resistance $R_S$ increases. The resistance $R_S$ thus increased seriously affects the noise characteristic of this heterojunction FET.

Accordingly, the bottom length of the recess at the source side should be designed to be possibly short in view of the FET performance.

On the other hand, the gate-drain capacitance $C_{gd}$ between the gate electrode and the drain electrode is dependent on the bottom length of the recess at the drain side. The capacitance $C_{gd}$ increases as the length decreases, and the capacitance thus increased causes deterioration of the FET performance such as a power gain in high-frequency applications.

Also, in high-output applications where both backward breakdown voltages of the gate electrodes and source-drain withstand voltages between the source and drain electrodes are high, the bottom length of the recess at the drain side should be typically longer than the bottom length of the recess at the source side in view of the FET performance.

Thus, more recently, the bottom length of the recess at the drain side has been designed to be longer than that at the source side, which is termed the "offset-gate structure" because the gate electrode is out of the longitudinal center of the recess.

Examples of conventional compound semiconductor FETs of this type having the offset-gate structure have been disclosed in the Japanese Non-Examined Patent Publication Nos. 3-145140 (published in June, 1991) and 61-154177 (published in July, 1986).

FIGS. 1A and 1B show the conventional FET disclosed in the Publication No. 3-145140, which is fabricated by the following process sequence:

First, as shown in FIG. 1A, a semiconductor substructure 41 is prepared, which is made of a semi-insulating GaAs substrate and some compound semiconductor layers such as a channel layer and a carrier-supply layer stacked on the substrate. The substructure 41 has source and drain electrodes (not shown) on its top surface.

Next, a silicon dioxide ($SiO_2$) film 42 is formed on the top surface of the substructure 41 to cover the source and drain electrodes by a chemical vapor deposition (CVD) process.

A first photoresist film 43 is then formed on the $SiO_2$ film 42 to be patterned, producing three windows 45-1, 45-2 and 45-3 that penetrate the film 43 between the source and drain electrodes. Using the photoresist film 43 thus patterned as a mask, the $SiO_2$ film 42 is selectively etched so that the film 42 has three penetrating holes placed at the corresponding positions to the windows 45-1, 45-2 and 45-3, respectively. Thus, the top surface of the substructure 41 is exposed from the first photoresist film 43 and the $SiO_2$ film 42 through the windows 45-1, 45-2 and 45-3 and the corresponding holes of the film 42.

A second photoresist film 44 is formed on the first photoresist film 43 to be patterned, producing a window 46 that penetrates the film 44 at a corresponding position to the central window 45-2 of the first photoresist film. Thus, the top surface of the substructure 41 is exposed from the first and second photoresist films 43 and 44 through the windows 45-2 and 46. The windows 45-1 and 45-2 of the first photoresist film 43 and the corresponding penetrating holes of the $SiO_2$ film 42 are filled with the material of the second photoresist film 44.

Subsequently, the $SiO_2$ film 42 is partially etched between the windows 45-1 and 45-3 through the window 46. Then, using the first and second photoresist films 43 and 44 thus patterned as a mask, the top surface of the substructure 41 is selectively etched through the windows 45-2 and 46 and the corresponding penetrating hole, producing a recess 47, as shown in FIG. 1B. The width of the recess 47 is defined by the windows 45-1 and 45-3.

Finally, a titanium-aluminum (Ti—Al) alloy film 48 is formed on the second photoresist film 44 to cover the window 46, and it is then removed with the first and second photoresist films 43 and 44 by a lift-off method. Through this process, only the part 48g of the Ti—Al film 48 is left in the recess 47, as shown in FIG. 1B, which acts as a gate electrode of this FET. The gate electrode 48g has a width $L_g$ at its bottom.

The bottom length $L_{41}$ of the recess between the source-side bottom edge of the recess 47 and the opposite bottom edge of the gate electrode 48g is substantially equal to the length between the source-side edge of the central window 45-2 and the opposite edge of the source-side window 45-1 of the first photoresist film 43.

Similarly, the bottom length $L_{42}$ of the recess between the drain-side bottom edge of the recess 47 and the opposite bottom edge of the gate electrode 48g is substantially equal to the length between the drain-side edge of the central window 45-2 and the opposite edge of the drain-side window 45-3 of the first photoresist film 43.

Since the length $L_{42}$ is longer than the length $L_{41}$, the gate electrode 48g is out of the longitudinal center of the recess 47, which means that the conventional compound semiconductor FET of FIGS. 1A and 1B has the offset-gate structure described previously.

FIGS. 2A and 2B show the conventional FET disclosed in the Publication No. 61-154177, which is fabricated by the following process sequence:

First, as shown in FIG. 2A, a semiconductor substructure 51 is prepared, which is made of a semi-insulating GaAs substrate and some compound semiconductor layers such as a channel layer and a carrier-supply layer stacked on the substrate. The substructure 51 has source and drain electrodes (not shown) on its top surface.

Next, a silicon nitride ($Si_3N_4$) film 52 is grown at a low temperature on the top surface of the substructure 51 to cover the source and drain electrodes by a plasma-enhanced CVD process. The film 52 is patterned to be left only at a corresponding area to a recess, as shown in FIG. 2A.

Then, a $SiO_2$ film 53 is grown on the top surface of the substructure 51 to cover the patterned $Si_3N_4$ film 52 by a CVD process 52, and a $Si_3N_4$ film 54 is grown on the $SiO_2$ film 53 thus grown through a plasma-enhanced CVD process.

A photoresist film 55 is formed on the $Si_3N_4$ film 54 to be patterned, producing a window 56 that penetrates the film 55 between the source and drain electrodes. Using the photoresist film 55 thus patterned as a mask, the underlying $Si_3N_4$ film 54 and the $SiO_2$ film 53 are selectively removed by a dry etching process, producing a hole that penetrates the films 54 and 53 at a corresponding position to the window 56. The patterned $Si_3N_4$ film 52 is exposed from the films 55, 54 and 53 at this stage.

Subsequently, the patterned $Si_3N_4$ film 52 is entirely removed by a wet etching process and the photoresist film 55 is removed. Then, the top surface of the substructure 51 thus exposed is selectively removed through the penetrating hole of the $Si_3N_4$ film 54 and the $SiO_2$ film 53, producing a recess 57 as shown in FIG. 2B. The shape of the recess 57 is defined by the patterned $Si_3N_4$ film 52.

Finally, a Ti—Al alloy film 58 is formed on the $Si_3N_4$ film 54 to cover the hole penetrating the films 54 and 53, and is then removed with the films 53 and 54 by a lift-off method. Thus, only the part 58g of the Ti—Al film 58 is left in the recess 57, as shown in FIG. 2B, which acts as a gate electrode of this FET. The gate electrode 58g has a width $L_g$ at its bottom, which is defined by the width of the hole penetrating the films 53 and 54.

The bottom length of the recess between the source-side bottom edge of the recess 57 and the opposite bottom edge of the gate electrode 58g is $L_{51}$. The bottom length of the recess between the drain-side bottom edge of the recess 57 and the opposite bottom edge of the gate electrode 48g is $L_{52}$.

With the fabrication method of the conventional FET shown in FIGS. 1A and 1B, the window 46 of the second photoresist film 44 is required to be aligned with the central window 45-2 of the first photoresist film 43 through visual adjustment during the exposure process of the second photoresist film 44. Thus, practically, in consideration of the accuracy limits of the present photolithography and etching techniques, the bottom length $L_{41}$ between the source-side bottom edge of the recess 47 and the opposite bottom edge of the gate electrode 48g is very difficult to be about 0.2 μm or less.

Therefore, a problem that the series resistance $R_S$ between the source and gate electrodes cannot be satisfactorily reduced occurs.

With the fabrication method of the conventional FET shown in FIGS. 2A and 2B, the window 56 of the photoresist film 55 is required to be aligned with the patterned $Si_3O_4$ film 52 at a possibly high accuracy through visual adjustment during the exposure process of the photoresist film 55.

The alignment accuracy of the present lithography technique has, however, a minimum limit of about ±0.1 μm. Therefore, the high-frequency performance or characteristic of the FET varies within a considerably wide extent because of the fluctuations in the series resistance $R_S$ and the gate-drain capacitance $C_{gd}$ that is due to the positional fluctuations between the recess 57 and the gate electrode 58g.

As a result, another problem that the bottom length $L_{51}$ of the recess between the source-side bottom edge of the recess 57 and the opposite bottom edge of the gate electrode 58g is very difficult to be designed about 0.2 μm or less occurs.

Additionally, there is also the same problem as the conventional FET of FIGS. 1A and 1B relating to the series resistance $R_S$.

SUMMARY OF THE INVENTION

Accordingly, an object of the present invention is to provide a fabrication method of a FET that enables to realize the source-side bottom length of the recess shorter than L4i the source-side bottom lengths $L_{41}$ and $L_{51}$ of the conventional ones at a higher accuracy than the minimum accuracy limit of the present lithography technique, i.e., about ±0.1 μm.

Another object of the present invention is to provide a fabrication method of a FET that enables to control separately the source-side bottom length of the recess and the drain-side bottom length thereof.

A fabrication method of a FET having an asymmetrical recess structure according to a first aspect of the present invention contains the following steps:

After a semiconductor substructure, which contains a semiconductor substrate, a first semiconductor layer formed on or over the substrate and a second semiconductor layer formed on the first semiconductor layer, is prepared, an insulator layer is formed on the second semiconductor layer. The insulator layer is then patterned to produce a first window at a corresponding position to a gate electrode of the FET, exposing the second semiconductor layer from the insulator layer through the first window.

Next, the second semiconductor layer is selectively removed using the insulator layer thus patterned as a mask by a first isotropically etching process in which an etch rate of the second semiconductor layer is higher than that of the first semiconductor layer so that the second semiconductor layer is divided into first and second sections, producing a symmetrical recess on the first semiconductor layer at a corresponding position to the first window. The first section has a first end and the second section has a second end opposite to the first end and the first and second ends are positioned symmetrically with respect to the first window.

The second end of the second section is selectively removed without removing the first end of the first section by a second isotropically etching process in which an etch rate of the second semiconductor layer is higher than that of the first semiconductor layer, so that an asymmetrical recess is produced from the symmetric recess. The first section of the second semiconductor layer acts as a source electrode of the FET and the second section of the second semiconductor layer acts as a drain electrode thereof.

Subsequently, a conductor layer is formed on the patterned insulator layer to be contacted with the first semiconductor layer through the first window at a bottom of the asymmetrical recess. The conductor layer is then selectively removed to remain in the asymmetrical recess and the first window. The remaining conductor layer forms the gate electrode that is in Schottky contact with the first semiconductor layer.

The insulator layer is then removed from the second semiconductor layer after the step of forming the gate electrode.

Thus, a source-side bottom length of the recess between a source-side bottom edge of the recess and an opposite bottom edge of the gate electrode is longer than a drain-side bottom length thereof between a drain-side bottom edge of the recess and an opposite bottom edge of the gate electrode, forming the asymmetrical recess structure.

With the method according to the first aspect, the source-side bottom length of the recess is defined by the first isotropically etching process of the second semiconductor layer. The drain-side bottom length thereof is defined by the first and second isotropically etching processes of the second semiconductor layer.

Therefore, both the source-side bottom length and the drain-side bottom length are dependent on only the thickness of the second semiconductor layer and etching parameters thereof such as an etch rate and an etching period of time. This means that these lengths are determined independent of the alignment or registration accuracy of the lithography technique.

As a result, the method of the first aspect enables to realize the source-side bottom length of the recess shorter than the source-side bottom lengths of the conventional ones at a higher accuracy than the minimum accuracy limit of the present lithography technique, i.e., about ±0.1 μm.

Additionally, the method of the first aspect enables to control separately the source- and drain-side bottom lengths of the recess.

Any semiconductor substrate of the semiconductor substructure may be used as the semiconductor substrate.

Any semiconductor layers may be used as the first and second semiconductor layers of the semiconductor substructure, respectively.

In a preferred embodiment, the substrate is made of a semi-insulating GaAs, the second semiconductor layer is made of GaAs and the fist semiconductor layer is made of $Al_xGa_{1-x}As$ where $0<x<1$.

Each of the first and second isotropically etching processes may be carried out by any isotropically etching process such as any wet etching process if the etch rate of the second semiconductor layer is higher than that of the first semiconductor layer.

Any conductor layer or a combination of stacked sublayers may be used as the conductor layer.

A fabrication method of a FET having an asymmetrical recess structure according to a second aspect of the present invention is almost the same as the method of the first aspect except that a semiconductor etch-stop layer is additionally formed between the first and second semiconductor layers of the semiconductor substructure.

With the method of the second aspect, the first semiconductor layer is not etched at all during the first and second isotropically etching processes by the etch-stop layer, which is an additional advantage.

Different from the method of the second aspect, the second semiconductor layer is inevitably etched during the etching processes slightly.

As the semiconductor etch-stop layer, any semiconductor layer may be used if it can stop the etching actions during the first and second etching processes.

In a preferred embodiment, as the etch-stop layer, a semiconductor layer that can form heterojunctions with the first and second semiconductor layers, respectively and that allows the gate electrode to be in Schottky contact therewith. If a semiconductor layer to be used is high in electric resistance, it should be possibly thin enough for a tunnelling current flowing through the etch-stop layer.

For example, when the substrate is made of a semiinsulating GaAs, the second semiconductor layer is made of GaAs and the fist semiconductor layer is made of $Al_xGa_{1-x}As$, the etch-stop layer is preferably made of $Al_yGa_{1-y}As$ where $0<x<y<1$.

A fabrication method of a FET having an asymmetrical recess structure according to a third aspect of the present invention contains the following steps:

After a semiconductor substructure is prepared, a source electrode and a drain electrode of the FET are formed on the second semiconductor layer. The substructure is the same in configuration as that of the method of the first aspect.

Next, a resist layer is formed on the second semiconductor layer to cover the source and drain electrodes. The resist layer is patterned to produce a first window at a corresponding position to a gate electrode of the FET, exposing the second semiconductor layer through the first window.

The second semiconductor layer is then selectively removed using the resist layer thus patterned as a mask by a first etching process in which an etch rate of the second semiconductor layer is higher than that of the fist semiconductor layer, so that the second semiconductor layer is divided into first and second sections, producing a symmetrical recess on the first semiconductor layer at a corresponding position to the first window. The first section has a first end and the second section has a second end opposite to the first end and the first and second ends are positioned symmetrically with respect to the first window.

A conductor layer is formed on the patterned resist layer to be contacted with the first semiconductor layer through the first window at a bottom of the symmetrical recess. The conductor layer is then selectively removed to remain in the symmetrical recess. The remaining conductor layer forms the gate electrode that is in Schottky contact with the first semiconductor layer.

The resist film is then removed from the second semiconductor layer after the step of forming the gate electrode.

Subsequently, the second end of the second section is selectively removed without removing the first end of the contact layer by a second etching process in which an etch rate of the second semiconductor layer is higher than that of the first semiconductor layer, so that an asymmetrical recess is produced from the symmetric recess.

Thus, a source-side bottom length of the recess between a source-side bottom edge of the recess and an opposite bottom edge of the gate electrode is longer than a drain-side bottom length of the recess between a drain-side bottom edge of the recess and an opposite bottom edge of the gate electrode, forming the asymmetrical recess structure.

With the method according to the third aspect, the source-side bottom length of the recess is defined by the first etching process of the second semiconductor layer. The drain-side bottom length thereof is defined by the first and second etching processes of the second semiconductor layer.

Therefore, both the source-side bottom length and the drain-side bottom length are dependent on only the thickness of the second semiconductor layer and etching parameters thereof such as an etch rate and an etching period of time. This means that these lengths are determined independent of the alignment or registration accuracy of the lithography technique.

As a result, similar to the method of the first aspect, the method of the third aspect enables to realize the source-side bottom length of the recess shorter than the source-side bottom lengths of the conventional ones at a higher accuracy than the minimum accuracy limit of the present lithography technique, i.e. , about ±0.1 µm.

Additionally, the method of the third aspect enables to control separately the source- and drain-side bottom lengths of the recess.

A fabrication method of a FET having an asymmetrical recess structure according to a fourth aspect of the present invention is almost the same as the method of the third aspect except that a semiconductor etch-stop layer is additionally formed between the first and second semiconductor layers of the semiconductor substructure.

With the method of the fourth aspect, the first semiconductor layer is not etched at all during the first and second etching processes by the etch-stop layer, which is an additional advantage.

Different from the method of the fourth, the second semiconductor layer is inevitably etched during the etching processes slightly in the method of the third aspect.

With the methods of the third and fourth aspects also, any semiconductor substrate of the semiconductor substructure may be used as the semiconductor substrate. Any semiconductor layers may be used as the first and second semiconductor layers of the semiconductor substructure, respectively.

In a preferred embodiment, the substrate is made of a semi-insulating GaAs, the second semiconductor layer is made of GaAs and the fist semiconductor layer is made of $Al_xGa_{1-x}As$ where $0<x<1$.

Each of the first and second etching processes may be carried out by any etching process such as any wet or dry etching process if the etch rate of the second semiconductor layer is higher than that of the first semiconductor layer.

Any conductor layer or a combination of stacked sublayers may be used as the conductor layer.

With the method of the fourth aspect, similar to the method of the third aspect, as the semiconductor etch-stop layer, any semiconductor layer may be used if it can stop the etching actions during the first and second etching processes.

In a preferred embodiment, as the etch-stop layer, a semiconductor layer that can form heterojunctions with the first and second semiconductor layers, respectively and that allows the gate electrode to be in Schottky contact therewith.

If a semiconductor layer to be used is high in electric resistance, it should be possibly thin enough for a tunnelling current flowing through the etch-stop layer.

For example, when the substrate is made of a semi-insulating GaAs, the second semiconductor layer is made of GaAs and the fist semiconductor layer is made of $Al_xGa_{1-x}As$, the etch-stop layer is preferably made of $Al_yGa_{1-y}As$ where $0<x<y<1$.

BRIEF DESCRIPTION OF THE DRAWINGS

FIGS. 8A to 8E are cross-sectional views showing a fabrication method of a FET according to a second embodiment of the invention, respectively.

DETAILED DESCRIPTION OF THE PREFERRED EMBODIMENTS

Figure 1A:
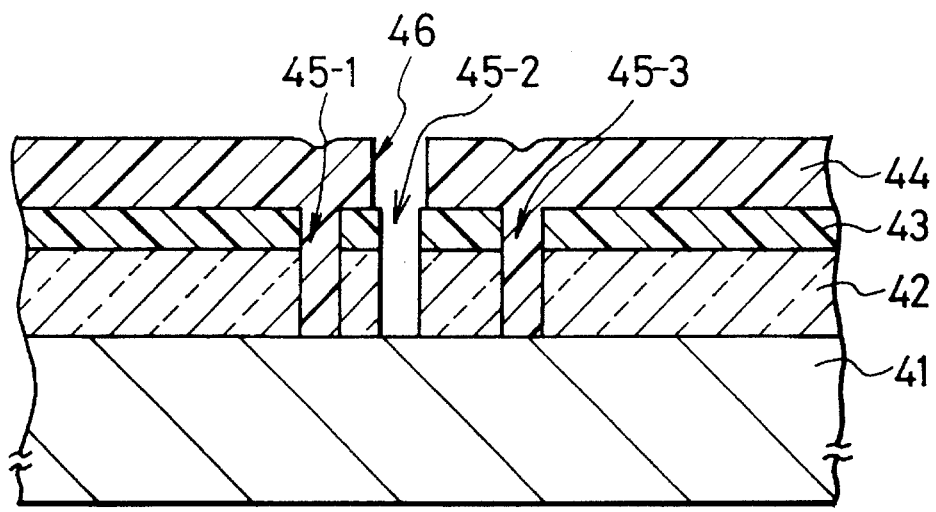
FIGS. 1A and 1B are cross-sectional views showing a conventional fabrication method of a FET, respectively.
Figure 1B:
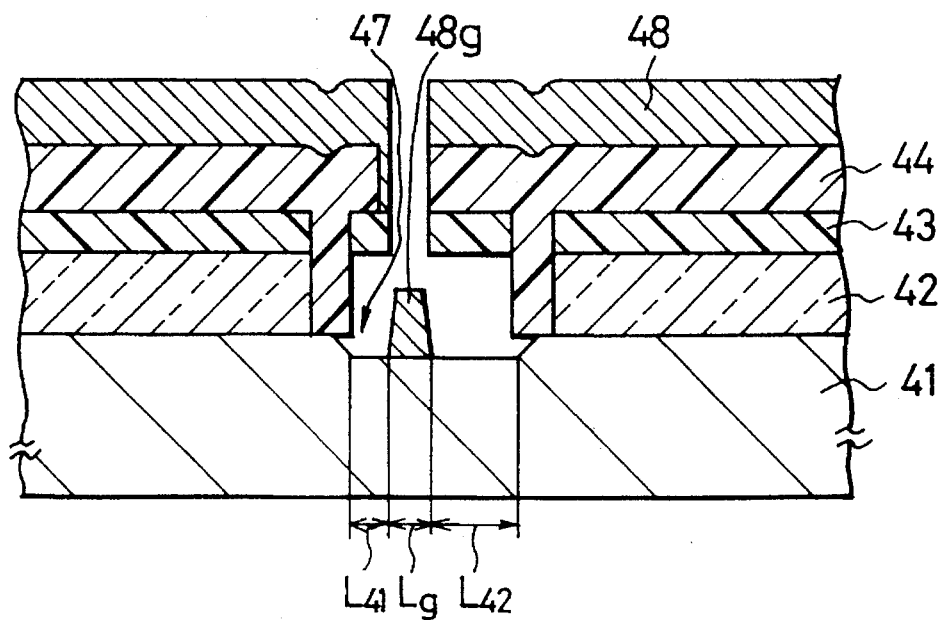
Figure 2A:
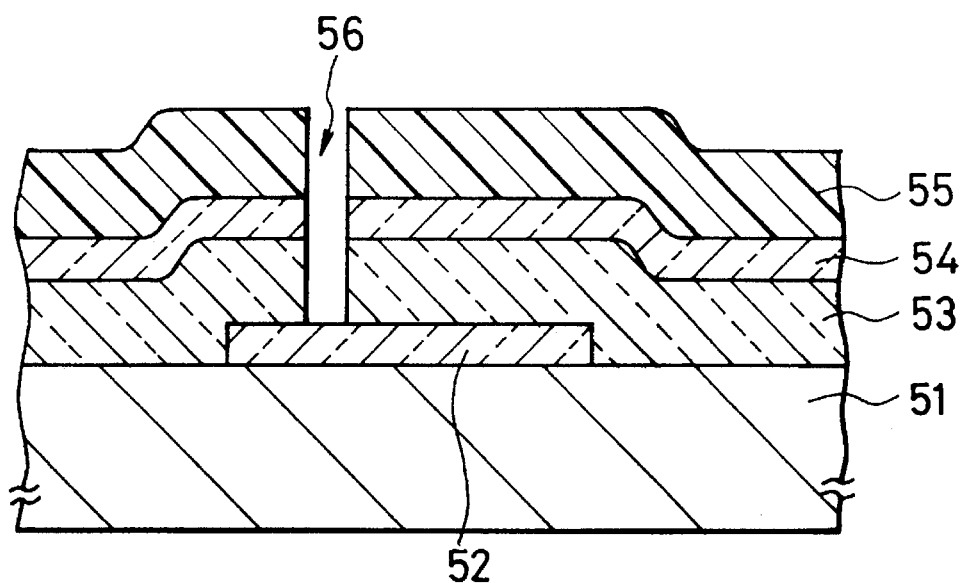
FIGS. 2A and 2B are cross-sectional views showing another conventional fabrication method of a FET, respectively.
Figure 2B:
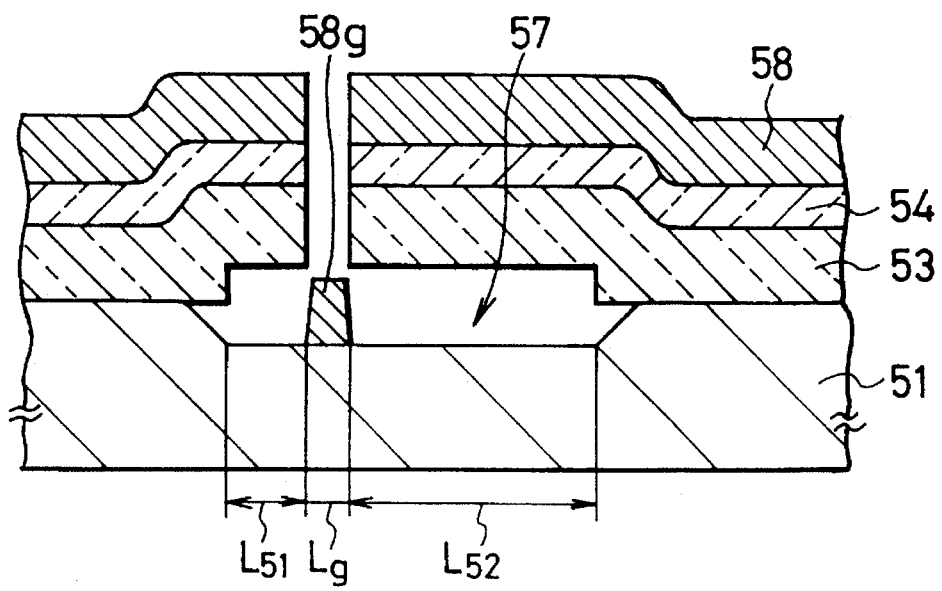

Preferred embodiments of the present invention will be described bellow while referring to the drawings attached.

First Embodiment

A fabrication method of a GaAs heterojunction FET according to a first embodiment is shown in FIGS. 3A and 3B, 4A and 4B, 5A and 5B, 6A and 6B, and 7A and 7B.

Figure 3A:
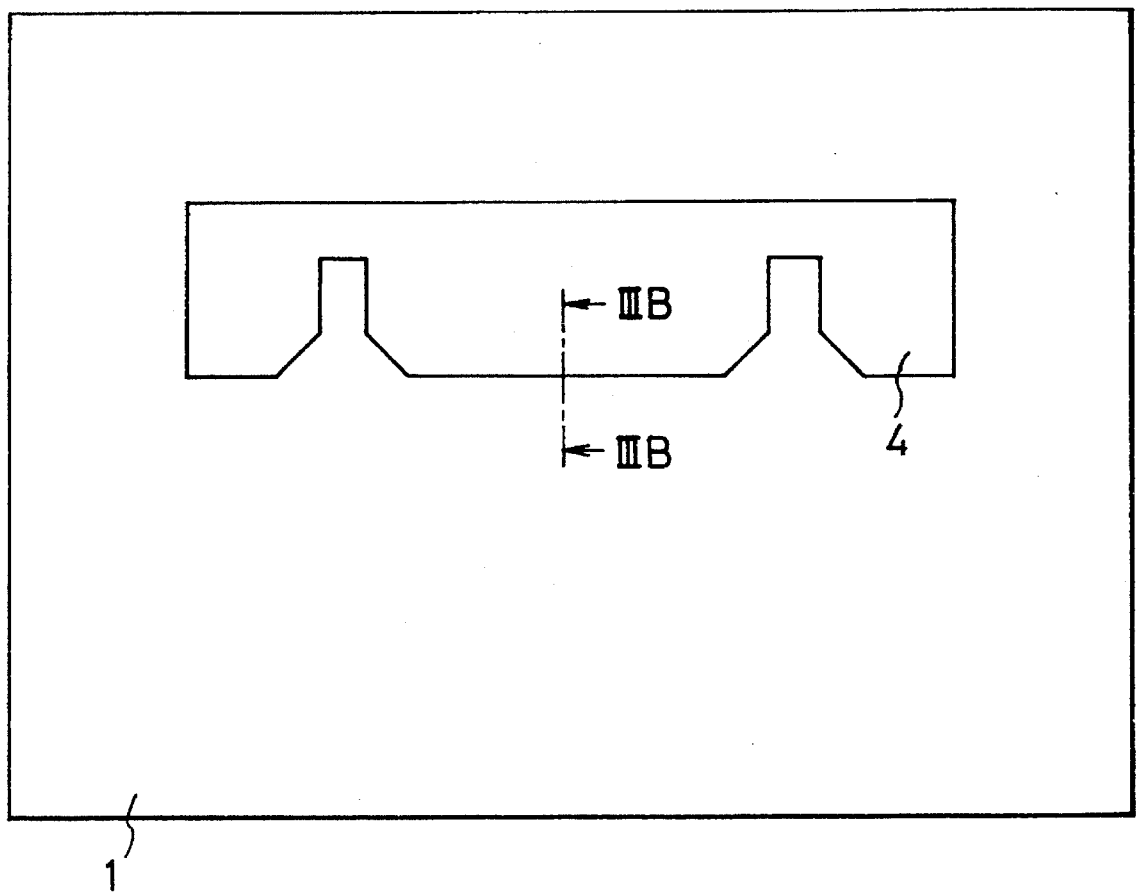
FIG. 3A is a plan view showing a fabrication method of a FET according to a first embodiment of the invention.
Figure 3B:
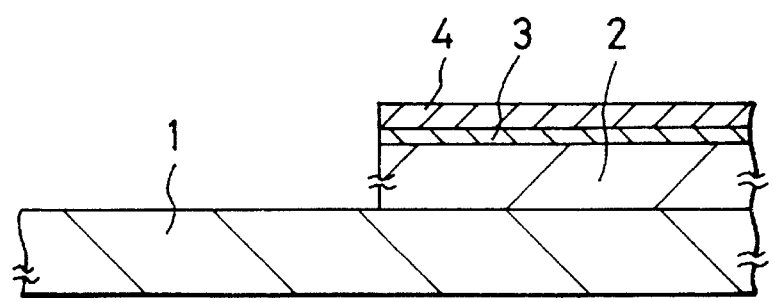
FIG. 3B is a partial cross-sectional view along the line IIIB—IIIB in FIG. 3A.

First, as shown in FIGS. 3A and 3B, an undoped GaAs channel layer 2 with a thickness of 500 nm is epitaxially grown on a semi-insulating GaAs substrate 1. An n-type $Al_{0.25}Ga_{0.75}As$ electron-supply layer 3 with a thickness of 35 nm is epitaxially grown on the channel layer 2. The layer 3 is doped with Si, the doping concentration $N_D$ of which is $2\times10^{18}$ atoms/cm$^3$. An n-type GaAs contact layer 4 with a thickness of 50 nm is epitaxially grown on the electron-supply layer 3. The layer 4 is doped with Si, the doping concentration $N_D$ of which is $5 \times 10^{18}$ atoms/cm$^3$. These layers 2, 3 and 4 are all grown by molecular-beam epitaxy (MBE) processes.

These layers 2, 3 and 4 thus stacked are patterned to form a mesa structure on the substrate 1 with a plan shape shown in FIG. 3A.

Figure 4A:
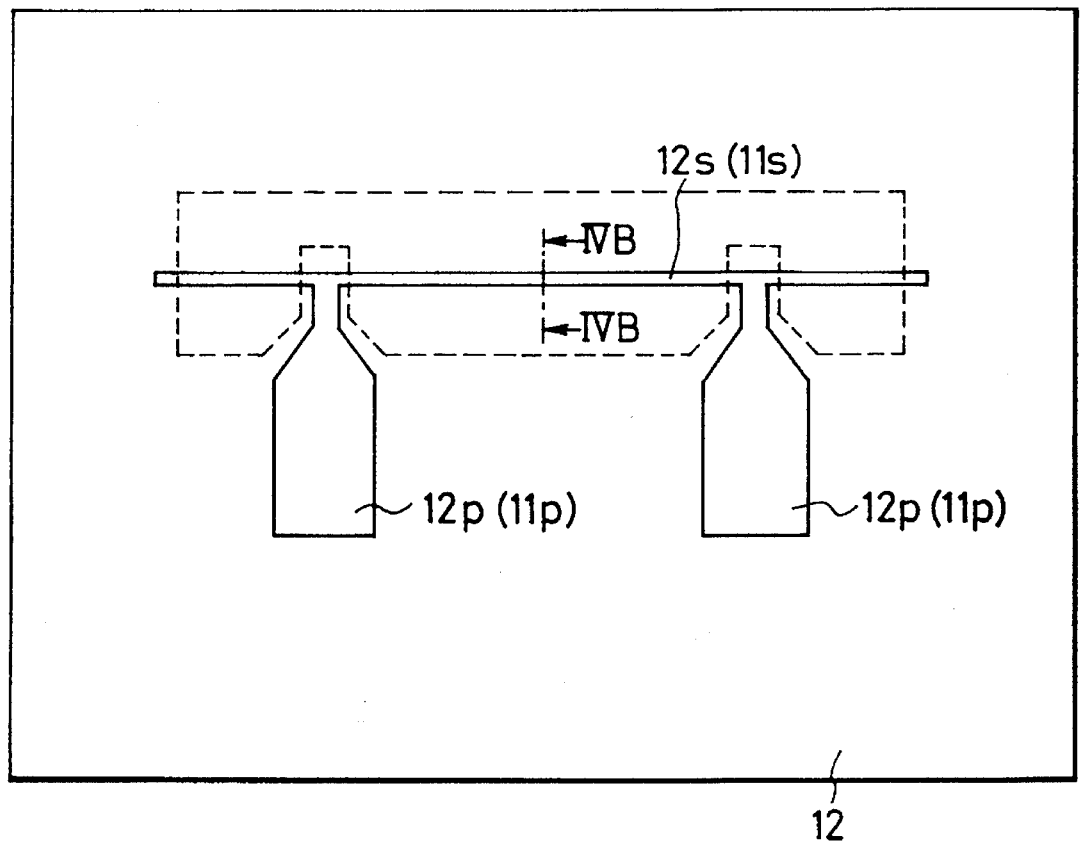
FIG. 4A is a plan view showing the fabrication method according to the first embodiment of the invention.
Figure 4B:
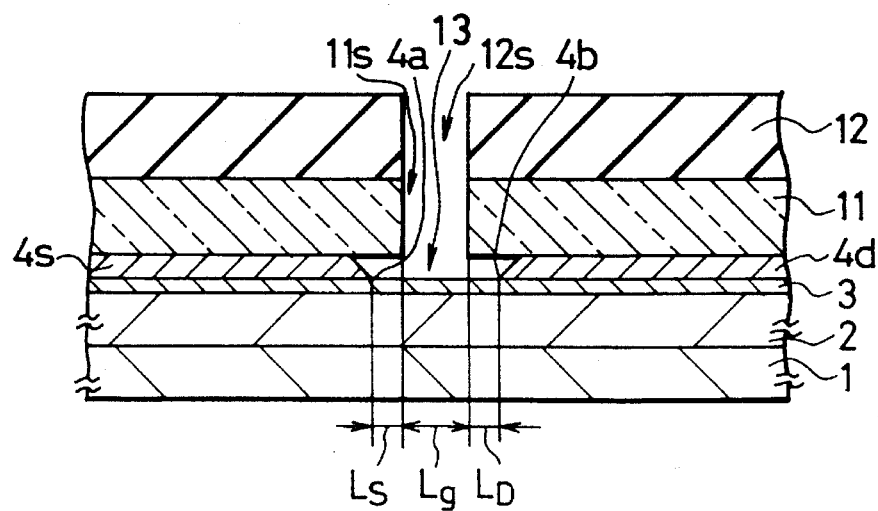
FIG. 4B is a partial cross-sectional view along the line IVB—IVB in FIG. 4A.

Next, as shown in FIGS. 4A and 4B, an insulator layer made of silicon dioxide (SiO$_2$) with a thickness of 250 nm is grown on the substrate 1 to cover the mesa structure by a CVD process. A first electron-resist layer 12 is then formed on the insulator layer 11 to be patterned by an electron-beam (EB) lithography process, forming a first penetrating window 12 with a strip-like subwindow 12s and two pentagon-like subwindows 12p in the resist layer 12. The strip-like subwindow 12s is 0.2 μm in width and is used for defining a gate electrode of this FET. The pentagon-like subwindow 12p are used for defining gate electrode pads of this FET.

Using the first resist layer 12 thus patterned as a mask, the insulator layer 11 is selectively removed by a reactive ion etching (RIE) process using a CF$_4$ gas, producing a strip-like through hole 11s and a pentagon-like through hole 11p in the insulator layer 11 at positions right below the strip-like subwindow 12s and the pentagon-like subwindow 12p of the resist layer 12, respectively.

Then, using the first resist layer 12 and the insulator layer 11 thus patterned as a mask, the underlying GaAs contact layer 4 is selectively removed by a dry etching process. Thus, a symmetrical recess 13 on the electron-supply layer 3 is produced at a position right below the strip-like through hole 11s of the insulator layer 11 inside the mesa structure, and two openings are produced at positions right below the respective pentagon-like through holes 11p thereof outside the mesa structure. The contact layer 4 is divided into a source-side section 4s and a drain-side section 4d by the recess 13.

This etching process is here a RIE process using the mixture of BCl$_3$ and SF$_6$ gasses, the mixture ratio (BCl$_3$/SF$_6$) of which is 3/1 in volume. Such the RIE process enables an isotropic etching action in which an etch rate for GaAs is 500 times or more as much as that for Al$_{0.25}$Ga$_{0.75}$As, in other words, the etch rate ratio (GaAs/Al$_{0.25}$Ga$_{0.75}$As) of which is 500/1 or more.

Through this etching process, as shown in FIG. 4B, the distance $L_S$ between a source-side bottom edge 4a of the contact layer 4 and a corresponding edge of the strip-like through hole 11s of the insulator layer 11 becomes 0.1 μm by controlling the etching period of time. Since this etching process is isotropic, the distance $L_D$ between an opposing drain-side bottom edge 4b of the contact layer 4 and an opposing, corresponding edge of the hole 11s also becomes 0.1 μm. This means that the recess 13 is symmetric with respect to the hole 11s.

Because the etch rate ratio or selectivity ratio (GaAs/Al$_{0.25}$Ga$_{0.75}$As) is 500/1 or more, the underlying n-type Al$_{0.25}$Ga$_{0.75}$As layer 3 is almost never etched during this process.

Subsequently, the first resist layer 12 is stripped off, and then a second resist layer 15, which is a positive-type photoresist one, is formed on the contact layer 4 to cover the remaining insulator layer 11. At this stage, the through holes 11s and 11p of the insulator layer 11 are covered with the second resist layer 15.

Figure 5A:
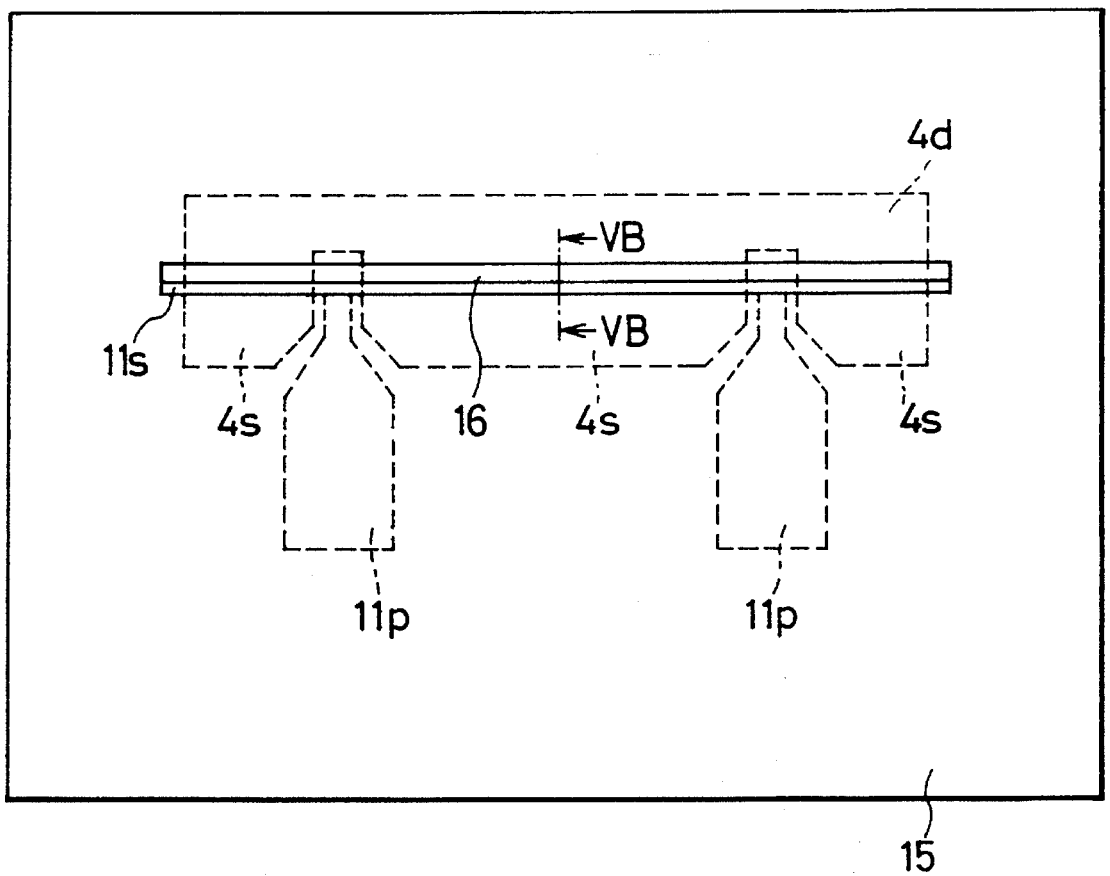
FIG. 5A is a plan view showing the fabrication method according to the first embodiment of the invention.
Figure 5B:
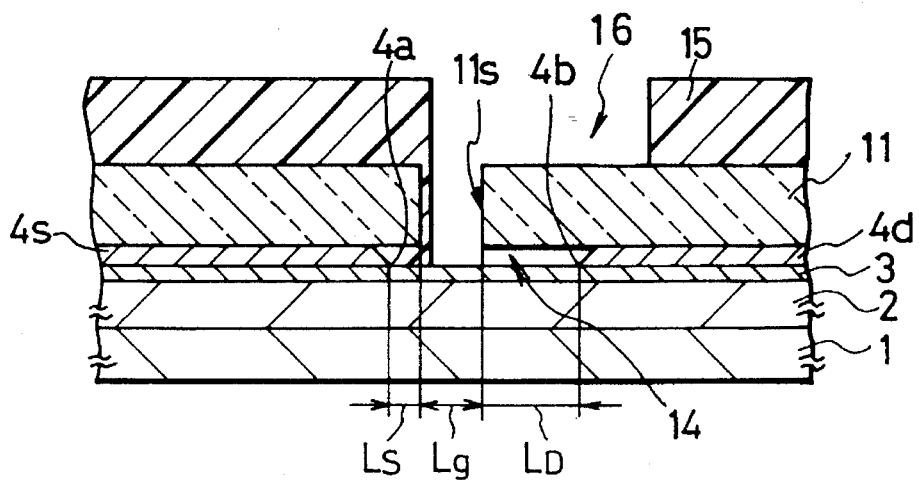
FIG. 5B is a partial cross-sectional view along the line VB—VB in FIG. 5A.

The second resist layer 15 is selectively exposed to ultra violet (UV) light and developed to be patterned by a popular photolithography process, resulting in a second penetrating window 16 in the layer 15, as shown in FIGS. 5A and 5B. The second window 16 is formed like a strip extending along the strip-like through hole 11s of the insulator layer 11 and being wider than the through hole 11s. Also, the window 16 covers the source-side end of the contact layer 4 and does not cover the drain-side end thereof.

An opening having a width of 0.05 μm or more is left in the hole 11s of the insulator layer 11 by the second resist layer 15 to allow an etching gas to flow into the recess 13.

During this photolithography process, the photoresist material flown into the drain-side area of the recess 13 placed under the insulator layer 11 is ensured to be removed since the material can be exposed by the UV light passing through the insulator layer 11 during the exposure process.

In this embodiment, the distances $L_S$ and $L_D$ are both 0.1 μm and the distance $L_g$ is 0.2 μm, and such the values can be realized at an alignment or registration accuracy of ±0.1 μm.

Using the second resist layer 15 thus patterned as a mask, the contact layer 4 is selectively etched again by an RIE process using the above-mentioned etching gas of the mixture of BCl$_3$ and SF$_6$ gasses. Thus, the uncovered drain-side end of the contact layer 4 is etched again so that the drain-side bottom edge 4b of the contact layer 4 shifts outward, resulting in an asymmetrical recess 14 between the source-side and drain-side sections 4s and 4d of the layer 4.

The etching period of time is controlled so that the distance $L_D$ between the drain-side bottom edge 4b of the contact layer 4 and the corresponding edge of the through hole 11s becomes 0.3 μm.

On the other hand, the covered source-side end of the contact layer 4 is not etched, so that the distance $L_S$ between the source-side bottom edge of the layer 4 and the corresponding edge of the hole 11s of the insulator layer is kept at 0.1 μm.

The source-side section 4s and the drain-side section 4d of the GaAs contact layer 4 thus formed act as a source electrode and a drain electrode of this FET, respectively.

Figure 6A:
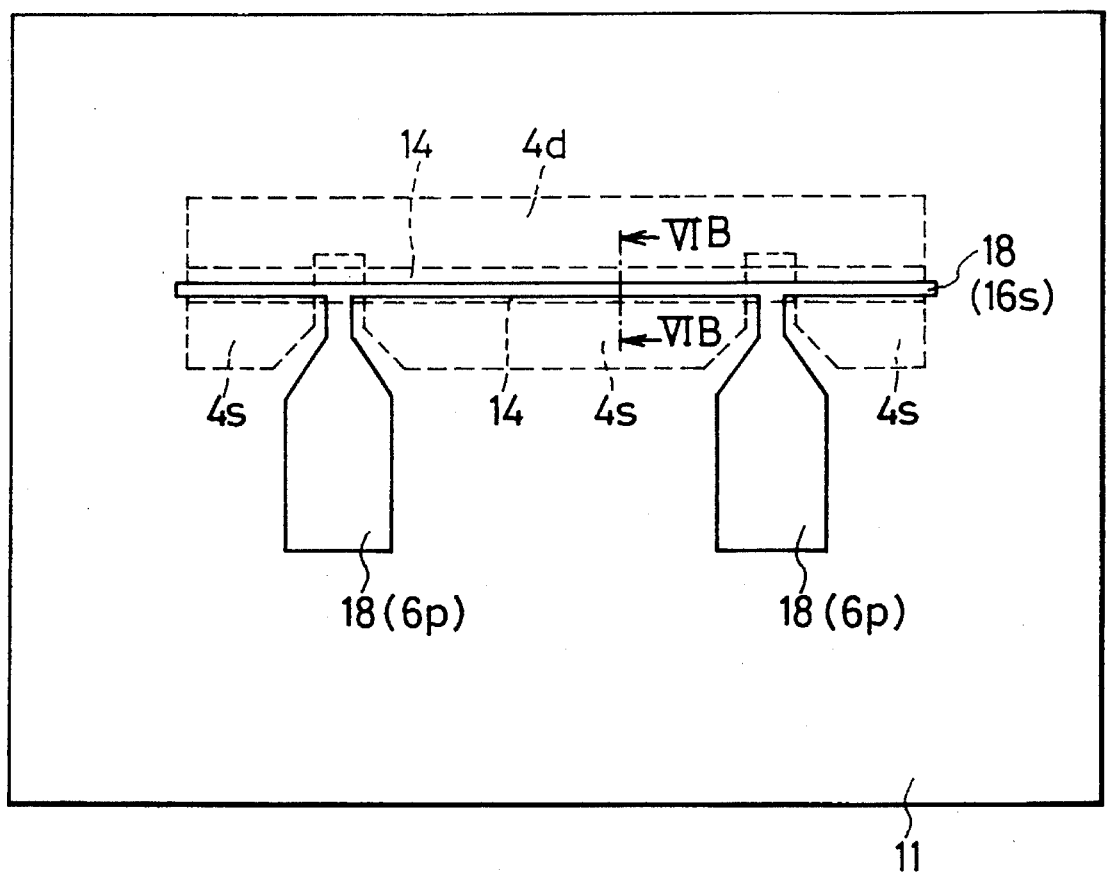
FIG. 6A is a plan view showing the fabrication method according to the first embodiment of the invention.
Figure 6B:
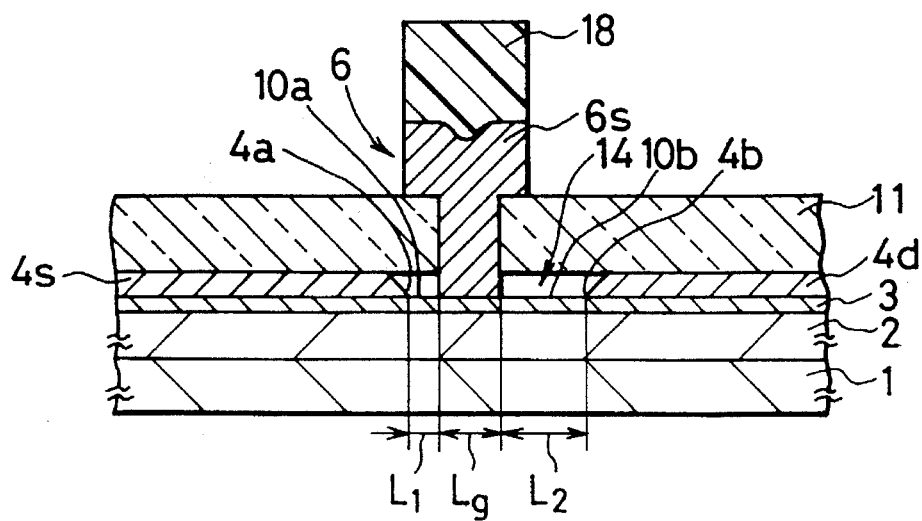
FIG. 6B is a partial cross-sectional view along the line VIB—VIB in FIG. 6A.

After stripping the second resist layer 15 off, as shown in FIGS. 6A and 6B, a conductor layer 6 is formed on the patterned insulator layer 11, and then a third resist layer 18 is formed on the conductor layer 6 to be patterned. The third resist layer 18 is made of a popular photoresist material and is patterned by a popular photolithography process.

Using the third resist layer 18 thus patterned as a mask, the conductor layer 6 is selectively removed by an ion-beam etching process using an argon (Ar) gas or by a RIE process using a fluorine (F$_2$) gas, resulting in a strip-like part 6s acting as a gate electrode of this FET and two pentagon-like parts 6p acting as gate electrode pads thereof.

The strip-like part 6s of the conductor layer 6 is extending along the strip-like through hole 11s of the insulator layer 11 and is in Schottky contact with the Al$_{0.25}$Ga$_{0.75}$As electron-supply layer 3 on the bottom of the recess 14.

The pentagon-like parts 6p of the conductor layer 6 are connected with the strip-like part 6s and are disposed on the GaAs substrate 1 outside the mesa structure.

In this embodiment, the conductor layer 6 is of a multi-layer structure made of a molybdenum (Mo) sublayer (100 nm in thickness) obtained by an evaporation process, a titanium nitride (Ti—N) sublayer (100 nm in thickness) obtained by a sputtering process, a platinum (Pt) sublayer (10 nm in thickness) obtained by a sputtering process, and a gold (Au) sublayer (300 nm in thickness) obtained by a sputtering process, which are stacked in this order.

The lowest Mo sublayer, which is in contact with the $Al_{0.25}Ga_{0.75}As$ electron-supply layer 3, is deposited by a directive evaporation process. Therefore, the obtainable width of the conductor layer 6, which is a gate width of this FET, can become substantially equal to the width of the strip-like through hole 11s of the insulator layer 11. As a result, the distance or length $L_1$ between the source-side bottom edge 4a and the opposing edge of the strip-like conductor layer 6s becomes substantially equal to the length $L_S$, and the distance or length $L_2$ between the drain-side bottom edge 4b and the opposing edge of the strip-like conductor layer 6s is substantially equal to the length $L_D$.

Subsequently, the third resist layer 18 is stripped off and then, the insulator layer 11 is etched off by buffered hydrofluoric acid.

Figure 7A:
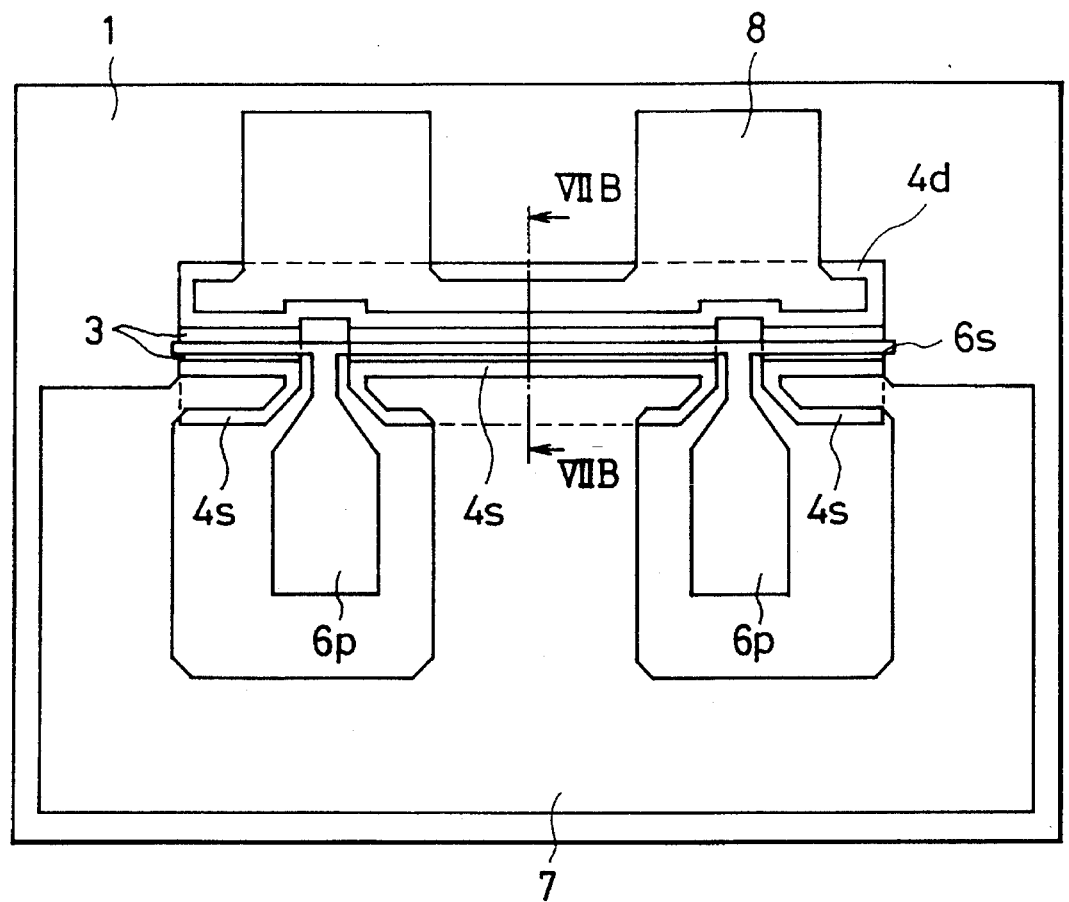
FIG. 7A is a plan view showing the fabrication method according to the first embodiment of the invention.
Figure 7B:
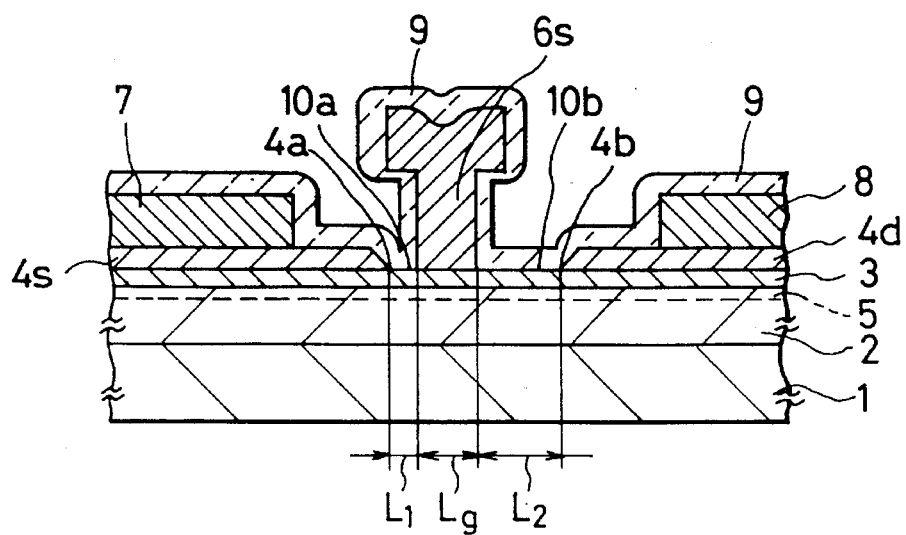
FIG. 7B is a partial cross-sectional view along the line VIIB—VIIB in FIG. 7A.

Another conductor layer is formed over the substrate 1 and is patterned, producing a source-side wiring or interconnection layer 7 and a drain-side wiring or interconnection layer 8, as shown in FIGS. 7A and 7B.

The source-side wiring layer 7 is formed on the substrate 1 on the source side with respect to the gate electrode 6s. The wiring layer 7 is partially stacked on the source-side section 4s of the contact layer 4 and is in Ohmic contact with this section 4s acting as the source contact. The wiring layer 7 is not in contact with the strip-like part 6s and the pentagon-like parts 6p.

The drain-side wiring layer 8 is formed on the substrate 1 on the drain side with respect to the gate electrode 6s. The wiring layer 8 is partially stacked on the drain-side section 4d of the contact layer 4 and is in Ohmic contact with this section 4s acting as the drain contact. The wiring layer 8 also is not in contact with the strip-like part 6s and the pentagon-like parts 6p.

Finally, a passivation layer 9 made of silicon nitride (Si—N) is formed over the entire substrate I by a plasma-enhanced CVD process. Then, through holes (not shown) for bonding are formed at the gate electrode pads 6p, and the source- and drain-side wiring layers 7 and 8, respectively. Thus, the FET of the first embodiment is finished.

To represent the plan arrangement or structure of this FET clearly, the passivation layer 9 is omitted in FIG. 7A.

With this FET, the GaAs channel layer 2, which is doped with no dopant by intention and is of possibly high purity, and the n-type $Al_{0.25}Ga_{0.76}As$ electron-supply layer 3 form a heterojunction, and an electron-accumulation layer 5 is generated in the vicinity of the heterojunction inside the GaAs channel layer 2 which is higher in electron affinity than the $Al_{0.25}Ga_{0.75}As$ electron-supply layer 3. The electron-accumulation layer 5 contains a 2-dimension electron gas.

When a variable bias voltage is applied to the gate electrode 6s, which is termed the gate voltage, the electron density of the 2-dimension electron gas in the channel layer 2 is modulated between the source and drain electrodes 4s and 4d. Thus, a current flowing between the electrodes 4s and 4d can be controlled by the gate voltage.

Here, the gate length $L_g$ is set as 0.2 µm so that this FET can operate at a high-frequency such as 4 GHz or higher with satisfactorily low noise and high power gain.

Also, it is important that a source-side bottom length $L_1$ of the recess 14, i.e., the length between the source-side bottom edge 4a of the contact layer 4 and the opposing edge of the gate electrode 6s, is possibly short in order to reduce the series resistance $R_s$. In view of this, the length $L_1$ is set as 0.1 µm.

Further, it is important that a drain-side bottom length $L_2$ of the recess 14, i.e., the length between the drain-side bottom edge 4b of the contact layer 4 and the opposing edge of the gate electrode 6s, is possibly short and is longer than $L_1$ in order to reduce satisfactorily the drain-gate capacitance $C_{gd}$ and to obtain a high power gain performance. In view of this, the length $L_2$ is set as 0.3 µm.

The thickness of the GaAs contact layer 4 can be controlled within the range of 50±0.5 nm due to an obtainable thickness accuracy or thickness controllability of the MBE process. Therefore, the following fact was confirmed through the inventors' experiments:

The length $L_i$ was able to be controlled within the range of 0.1±0.02 µm if the etch rate of the contact layer 4 was set as about 10 nm/sec.

With the conventional fabrication methods described previously, since the registration or alignment accuracy of the photolithogaphy process was ±0.1 µm, the obtainable length $L_1$ was limited to about 0.2±0.12 µm. The series resistance $R_s$ per unit gate width was about 0.6±0.2Ω.mm.

On the other hand, with the first embodiment, because of no dependence on the registration accuracy of the lithography process, the shorter length $L_1$ was able to be realized with a very high accuracy, for example, 0.1±0.02 µm. As a result, an obtainable series resistance $R_s$ per unit gate width was 0.5±0.08Ω.mm, which was improved by 0.1Ω.mm in average compared with the conventional ones. Also, the variation or dispersion of the resistance $R_s$ was drastically improved.

Accordingly, both the high-frequency noise characteristic of this FET and its dispersion were reduced, providing drastic improvement in fabrication yield.

Second Embodiment

A fabrication method of a GaAs heterojunction FET according to a second embodiment is shown in FIGS. 8A to 8E, which is equivalent to that of the first embodiment other than that an etch-stop layer is additionally provided between an n-type $Al_{0.25}Ga_{0.75}As$ electron-supply layer and an n-type GaAs contact layer.

First, as shown in FIG. 8A, an undoped GaAs channel layer 2 with a thickness of 500 nm is epitaxially grown on a semi-insulating GaAs substrate 1. An n-type $Al_{0.25}Ga_{0.75}As$ electron-supply layer 3 with a thickness of 35 nm is epitaxially grown on the channel layer 2. An undoped $Al_{0.4}Ga_{0.6}As$ etch-stop layer 19 with a thickness of 3 nm is epitaxially grown on the electron-supply layer 3. An n-type GaAs contact layer 4 with a thickness of 50 nm is epitaxially grown on the electron-supply layer 3. The layer 4 is doped with Si, the doping concentration $N_D$ of which is $5\times10^{18}$ atoms/cm$^3$. These layers 2, 3, 19 and 4 are all grown by molecular-beam epitaxy (MBE) processes.

These layers 2, 3, 19 and 4 thus stacked are patterned to form a mesa structure on the substrate 1 with the same plan shape as shown in FIG. 3A.

The above process steps are the same as those of the first embodiment except for the formation process of the etch-stop layer 19 is added.

As the etch-stop layer 19, any semiconductor layer may be used if it can form heterojunctions with the carrier-supply layer 3 and the contact layer 4, respectively, and it allows the gate electrode 6s to be in Schottky contact therewith. If a semiconductor layer to be used as the etch-stop layer 19 is high in electric resistance, it should be possibly thin enough for a tunnelling current flowing through the etch-stop layer 19.

Next, as shown in FIG. 8B, an insulator layer 11 made of $SiO_2$ with a thickness of 250 nm is grown on the substrate 1 to cover the mesa structure, and a first electron-resist layer 12 is then formed on the insulator layer 11 to be patterned, forming a first penetrating window made of a strip-like subwindow 12s and two pentagon-like subwindows 12p in the resist layer 12. These process steps are the same as those of the first embodiment.

Using the first resist layer 12 thus patterned as a mask, the insulator layer 11 is selectively removed by a wet etching process, instead of a RIE process for the first embodiment, producing a strip-like through hole 11s and two pentagon-like through holes 11p in the insulator layer 11 at positions right below the strip-like subwindow 12s and the pentagon-like subwindow 12p of the resist layer 12, respectively.

This wet etching process is carried out using the mixture of a 50-weight % water solution of citric acid ($C_6H_8O_7$) and a 30%-concentration water solution of hydrogen peroxide ($H_2O_2$), the mixture ratio or volume ratio ($C_6H_8O_7/H_2O_2$) of which is 3/1. Thus, an etch rate of the GaAs contact layer 4 can become 200 times or more as much as that of the $Al_{0.4}Ga_{0.6}As$ etch-stop layer 19, in other words, the etch rate ratio ($GaAs/Al_{0.4}Ga_{0.6}As$) of which is 200/1 or more.

Then, using the first resist layer 12 and the insulator layer 11 thus patterned as a mask, the underlying GaAs contact layer 4 is selectively removed by the same RIE etching process as that of the first embodiment. Thus, a symmetrical recess 13 and two openings are produced on the etch-stop layer 19. The contact layer 4 is divided into a source-side section 4s and a drain-side section 4d by the recess 13.

The distance $L_S$ between a source-side bottom edge 4a of the contact layer 4 and a corresponding edge of the strip-like through hole 11s of the insulator layer 11 and the distance $L_D$ between an opposing drain-side bottom edge 4b of the contact layer 4 and an opposing, corresponding edge of the hole 11s are both 0.1 μm. The width or distance $L_g$ of the strip-like opening 11s is 0.2 μm. These distances $L_S$, $L_D$ and $L_g$ are the same as those of the first embodiment.

Because the etch rate ratio or selectivity ratio ($GaAs/Al_{0.4}Ga_{0.6}As$) is 200/1 or more, the underlying, undoped $Al_{0.4}Ga_{0.6}As$ layer 19 is almost never etched during this process.

Subsequently, the first resist layer 12 is stripped off, and then a second resist layer 15, which is a positive-type photoresist one, is formed on the contact layer 4 to cover the remaining insulator layer 11. The second resist layer 15 is selectively exposed to UV light and developed to be patterned by the same photolithography process, resulting in a second penetrating window 16 with a strip-like shape in the layer 15, as shown in FIG. 8C. The window 16 covers the source-side end of the contact layer 4 and does not cover the drain-side end thereof.

An opening having a width of 0.05 μm or more is left in the hole 11s of the insulator layer 11 by the second resist layer 15 to allow an etching gas to flow into the recess 13, which is the same as that of the first embodiment.

Using the second resist layer 15 thus patterned as a mask, the contact layer 4 is selectively etched again by a wet etching process using the same etching solution as used in the prior etching process for forming the symmetrical recess 13. Thus, the uncovered drain-side end of the contact layer 4 is etched again so that the drain-side bottom edge 4b of the contact layer 4 shifts outward, resulting in an asymmetrical recess 14 between the source-side and drain-side sections 4s and 4d of the layer 4.

The etching period of time is controlled so that the distance $L_D$ between the drain-side bottom edge 4b of the contact layer 4 and the corresponding edge of the through hole 11s becomes 0.3 μm. On the other hand, the covered source-side end of the contact layer 4 is not etched, so that the distance $L_S$ between the source-side bottom edge of the layer 4 and the corresponding edge of the hole 11s of the insulator layer 11 is kept at 0.1 μm. This etching process is the same as that of the first embodiment.

Figure 8D:
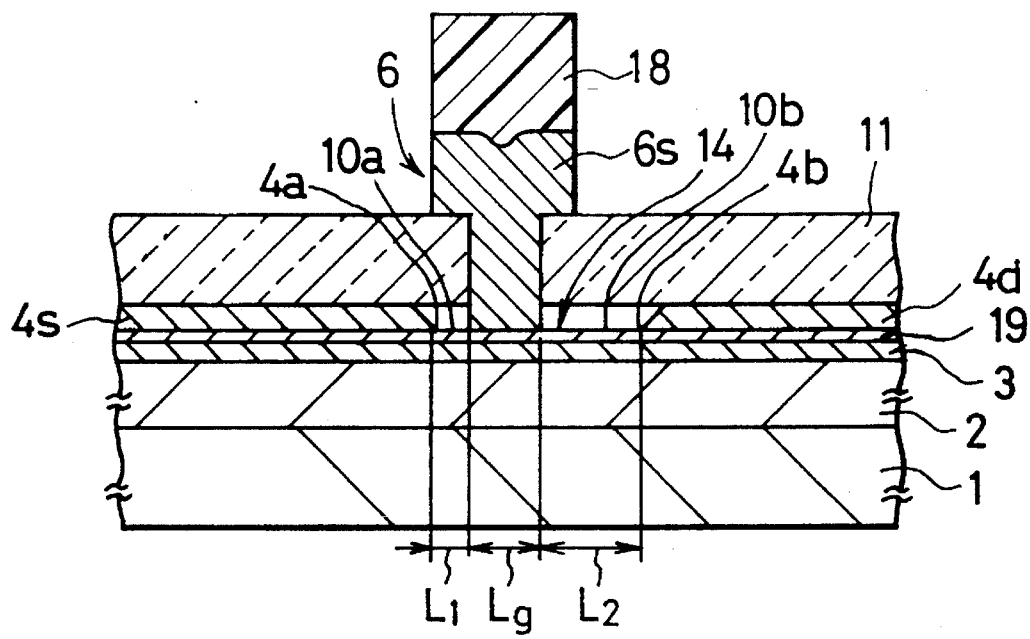

After stripping the second resist layer 15 off, as shown in FIG. 8D, a conductor layer 6 is formed on the patterned insulator layer 11, and then a third resist layer 18 is formed on the conductor layer 6 to be patterned. Using the third resist layer 18 thus patterned as a mask, the conductor layer 6 is selectively removed by the same etching process as used in the first embodiment, resulting in a strip-like part 6s acting as a gate electrode of this FET and two pentagon-like parts 6p acting as gate electrode pads thereof.

In the second embodiment, the conductor layer 6 is of a multilayer structure made of a tungsten (W) sublayer (10 nm in thickness), a Ti sublayer (100 nm in thickness), a Pt sublayer (10 nm in thickness), and a Au sublayer (300 nm in thickness), which are stacked in this order. These sublayers are all obtained by evaporation processes.

The lowest W sublayer, which is in contact with the $Al_{0.4}Ga_{0.6}As$ etch-stop layer 19, is deposited by a directive evaporation process. Therefore, the obtainable width of the conductor layer 6, which is a gate width of this FET, can become substantially equal to the width of the strip-like through hole 11s of the insulator layer 11. As a result, the distance or length $L_1$ between the source-side bottom edge 4a and the opposing edge of the strip-like conductor layer 6s becomes substantially equal to the length $L_S$, and the distance or length $L_2$ between the drain-side bottom edge 4b and the opposing edge of the strip-like conductor layer 6s is substantially equal to the length $L_D$.

Subsequently, the third resist layer 18 is stripped off and then, the insulator layer 11 is etched off by buffered hydrofluoric acid, which is the same as that of the first embodiment.

Another conductor layer is then formed over the substrate 1 and is patterned, producing a source-side wiring or interconnection layer 7 and a drain-side wiring or interconnection layer 8, the arrangements of which are the same as those in the first embodiment.

Figure 8E:
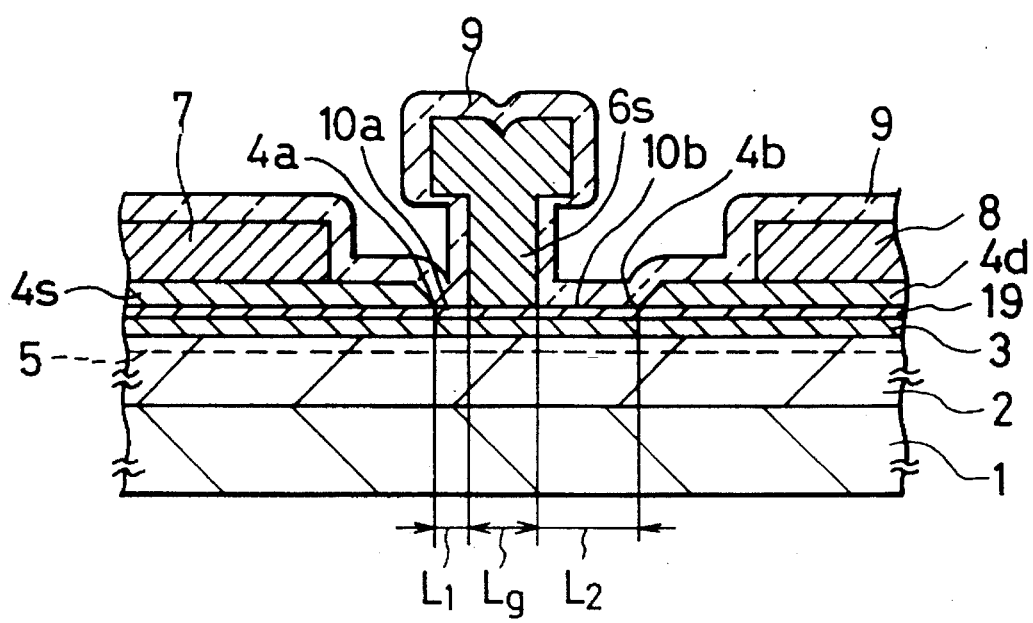

Finally, a passivation layer 9 made of Si—N is formed over the entire substrate 1 and then, through holes (not shown) for bonding are formed at the gate electrode pads 6p, and the source- and drain-side wiring layers 7 and 8, respectively through the same process as that of the first embodiment. Thus, the FET of the second embodiment as shown in FIG. 8E is finished.

With the FET of the second embodiment also, the undoped GaAs channel layer 2 and the n-type $Al_{0.25}Ga_{0.75}As$ electron-supply layer 3 form a heterojunction, and an electron-accumulation layer 5 containing a 2-dimension electron gas is generated in the vicinity of the heterojunction inside the GaAs channel layer 2, resulting in the same operation as that of the first embodiment.

Also in the second embodiment, the gate length $L_g$ is set as 0.2 μm and the lengths $L_1$ and $L_2$ are set as 0.1 μm and 0.3 μm, respectively.

Through the inventors' experiment, the thickness of the GaAs contact layer 4 was able to controlled within the range of 50±0.5 nm due to an obtainable thickness accuracy or thickness controllability of the MBE process. The length $L_1$ was able to be controlled within the range of 0.1±0.02 µm if the etch rate of the contact layer 4 was set as about 6 nm/sec.

In addition, because of no dependence on the registration accuracy of the lithography process, the shorter length $L_1$ was able to be realized with a very high accuracy, for example, 0.1±0.02 µm. As a result, an obtainable series resistance $R_S$ per unit gate width was 0.5±0.08Ω.mm, which was improved by 0.1Ω.mm in average compared with the conventional ones. Also, the variation or dispersion of the resistance $R_S$ was drastically improved.

Accordingly, both the high-frequency noise characteristic of the FET of the second embodiment and its dispersion were reduced, providing drastic improvement in fabrication yield.

The second embodiment has an additional advantage that any wet etching process the etch rate ratio of which is comparatively low can be employed due to the etch-stop layer 19, which means that the FET is more readily fabricated than that in the first embodiment where a dry etching process is employed.

Third Embodiment

A fabrication method of a GaAs heterojunction FET according to a third embodiment is shown in FIGS. 9A to 9E.

Figure 9A:
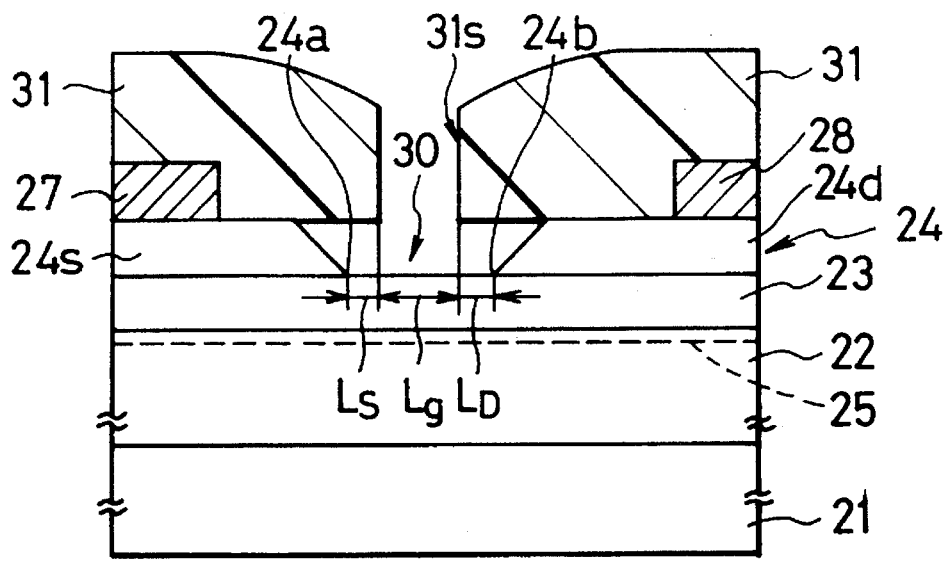
FIGS. 9A to 9E are cross-sectional views showing a fabrication method of a FET according to a third embodiment of the invention, respectively.

First, as shown in FIG. 9A, an undoped GaAs channel layer 22 with a thickness of 500 nm is epitaxially grown on a semi-insulating GaAs substrate 21. An n-type $Al_{0.25}Ga_{0.75}As$ electron-supply layer 23 with a thickness of 35 nm is epitaxially grown on the channel layer 22. The layer 23 is doped with Si, the doping concentration $N_D$ of which is $2 \times 10^{18}$ atoms/cm$^3$. An n-type GaAs contact layer 24 with a thickness of 50 nm is epitaxially grown on the electron-supply layer 23. The layer 24 is doped with Si, the doping concentration $N_D$ of which is $5 \times 10^{18}$ atoms/cm$^3$. These layers 22, 23 and 24 are all grown by MBE processes.

The MBE processes are the same as those in the first embodiment.

Next, a AuGeNi alloy layer is formed on the contact layer 24 by an evaporation process and is patterned by popular photolithography and lift-off processes, forming a source electrode 27 and a drain electrode 28, as shown in FIG. 9A.

Then, the source and drain electrodes 27 and 28 are subject to heat-treatment at about 400° C. in an hydrogen ($H_2$) atmosphere, making an alloy of the AuGeNi electrodes 27 and 28 and the GaAs contact layer 24 at their interfaces. Thus, the electrodes 27 and 28 become in Ohmic contact with the contact layer 24 with low resistances.

An EB resist layer 31 is formed on the contact layer 24 to cover the source and drain electrodes 27 and 28 thus alloyed to be exposed and developed by using an electron-beam exposure system, forming a strip-like, penetrating window 31a in the layer 31 between the source and drain electrodes 27 and 28. The window 31a is used for defining a gate electrode of the FET and is 0.2 µm in width.

Using the EB resist layer 31 thus patterned as a mask, the underlying contact layer 24 is selectively removed by a RIE process using the mixture of $BCl_3$ and $SF_6$ gases the mixture ratio ($BCl_3/SF_6$) of which is 3/1 in volume, producing a strip-like, symmetrical recess 30 on the electron-supply layer 23. The contact layer 24 is divided into a source-side section 24s and a drain-side section 24d by the recess 30.

As already described in the first embodiment, such RIE process enables an isotropic etching action in which an etch rate for GaAs is 500 times or more as much as that for $Al_{0.25}Ga_{0.75}As$, in other words, the etch rate ratio (GaAs/$Al_{0.25}Ga_{0.75}As$) of which is 500/1 or more. Through this RIE process, as shown in FIG. 9A, the distance $L_S$ between a source-side bottom edge 24a of the contact layer 24 and a corresponding edge of the strip-like through hole 31s of the EB resist layer 31 becomes 0.05 µm by controlling the etching period of time. Since this etching process is isotropic, the distance $L_D$ between an opposing drain-side bottom edge 24b of the contact layer 24 and an opposing, corresponding edge of the hole 31s also becomes 0.05 µm. This means that the recess 30 is symmetric with respect to the hole 31s.

Because the etch rate ratio or selectivity ratio (GaAs/$Al_{0.25}Ga_{0.75}As$) is 500/1 or more, the underlying n-type $Al_{0.25}Ga_{0.75}As$ layer 23 is almost never etched during this process.

Figure 9B:
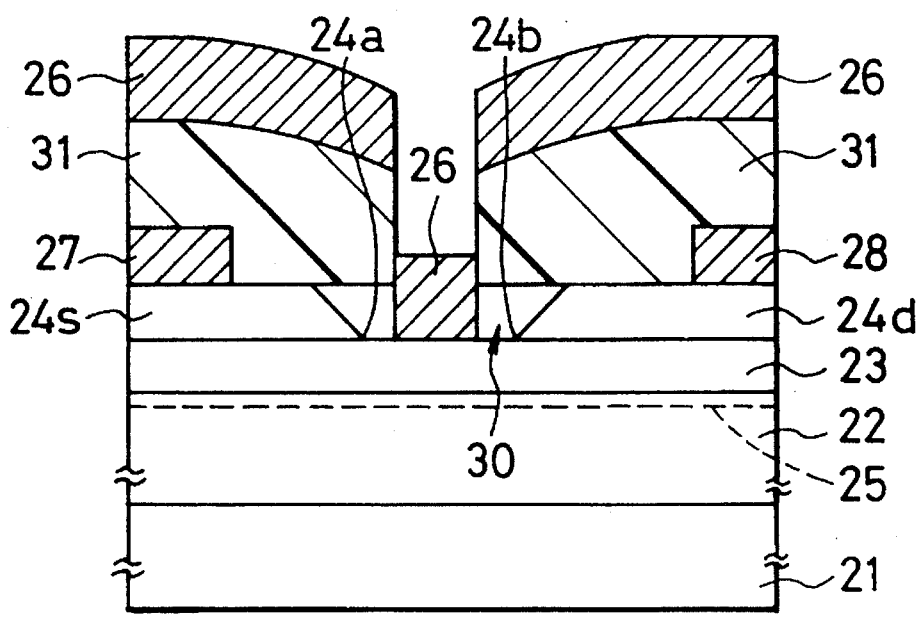

Subsequently, without stripping the EB resist layer 31 off, an aluminum (Al) layer 26 is formed on the resist layer 31 to cover the window 31 of the layer 31 by a vacuum evaporation process, as shown in FIG. 9B. At this stage, the Al layer 26 is partially deposited on the electron-supply layer 23 through the window 31.

Figure 9C:
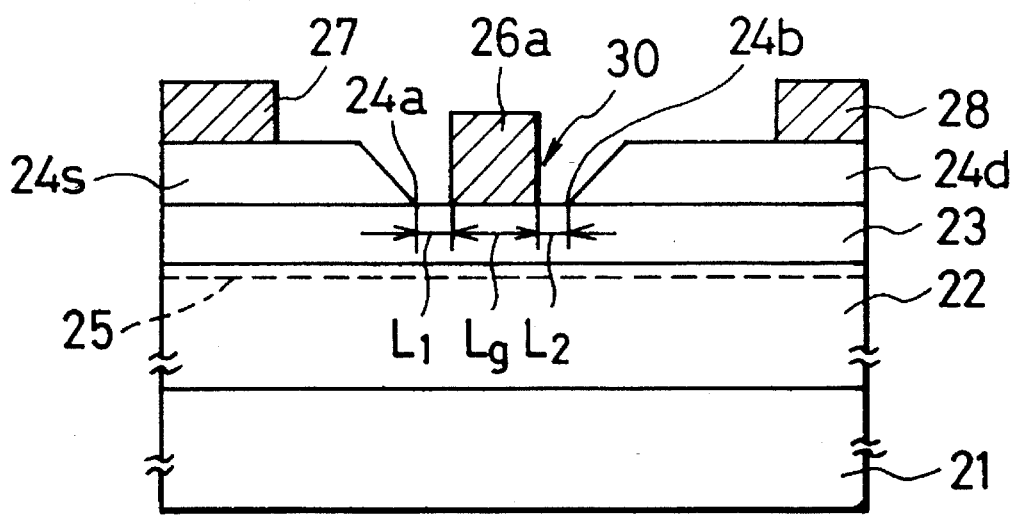
Figure 9D:
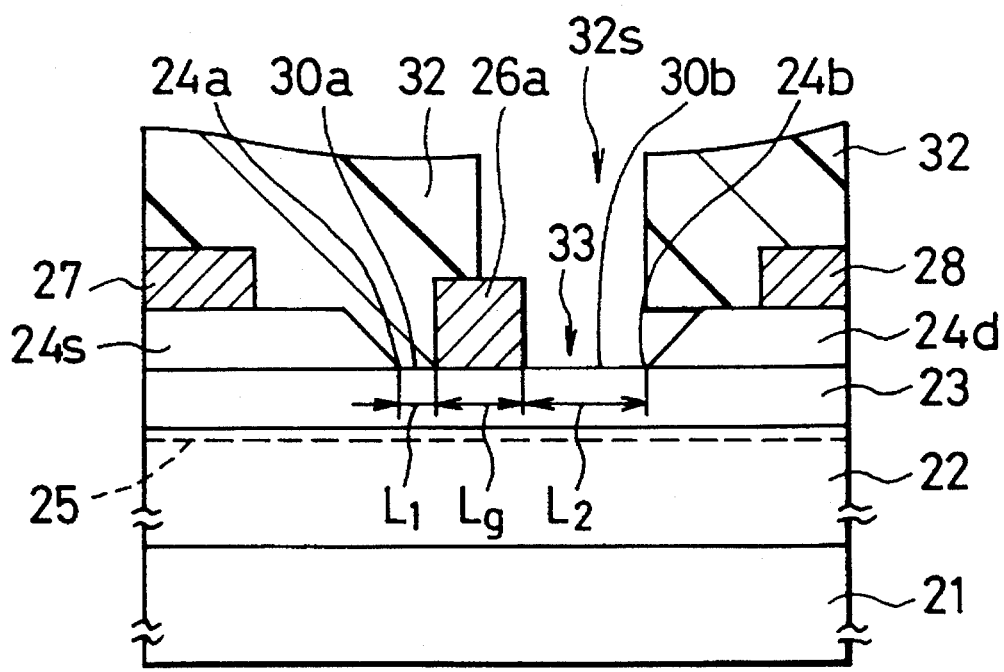

The EB resist layer 31 is then stripped off by a lift off process so that the overlying Al layer 26 is selectively removed, leaving a strip-like part 26a of the layer 26 in the recess 30, as shown in FIG. 9C. The part 26a acts as the gate electrode of this FET and is positioned at the center of the recess 30.

A photoresist layer 32 is formed on the contact layer 24 to cover the source and drain electrodes 27 and 28 and the gate electrode 26a, and is patterned by a popular photolithography process. The patterned layer 32 has a penetrating window the width of which is from the longitudinal center of the gate electrode 26a to the drain-side bottom edge 24b of the contact layer 24.

Using the photoresist layer 32 thus patterned as a mask, the contact layer 24 is selectively etched again by an RIE process using the above-mentioned etching gas of the mixture of $BCl_3$ and $SF_6$ gasses. Thus, the uncovered drain-side end of the contact layer 24 is etched again so that the drain-side bottom edge 24b of the contact layer 24 shifts outward, resulting in an asymmetrical recess 33 between the source-side and drain-side sections 24s and 24d of the layer 24.

The etching period of time is controlled so that the distance $L_2$ between the drain-side bottom edge 24b and the opposing edge of the gate electrode 26a becomes 0.35 µm.

On the other hand, the covered source-side end of the contact layer 24 is not etched, so that the distance $L_1$ between the source-side bottom edge 24a and the opposing edge of the gate electrode 26a is kept at 0.05 µm.

Figure 9E:
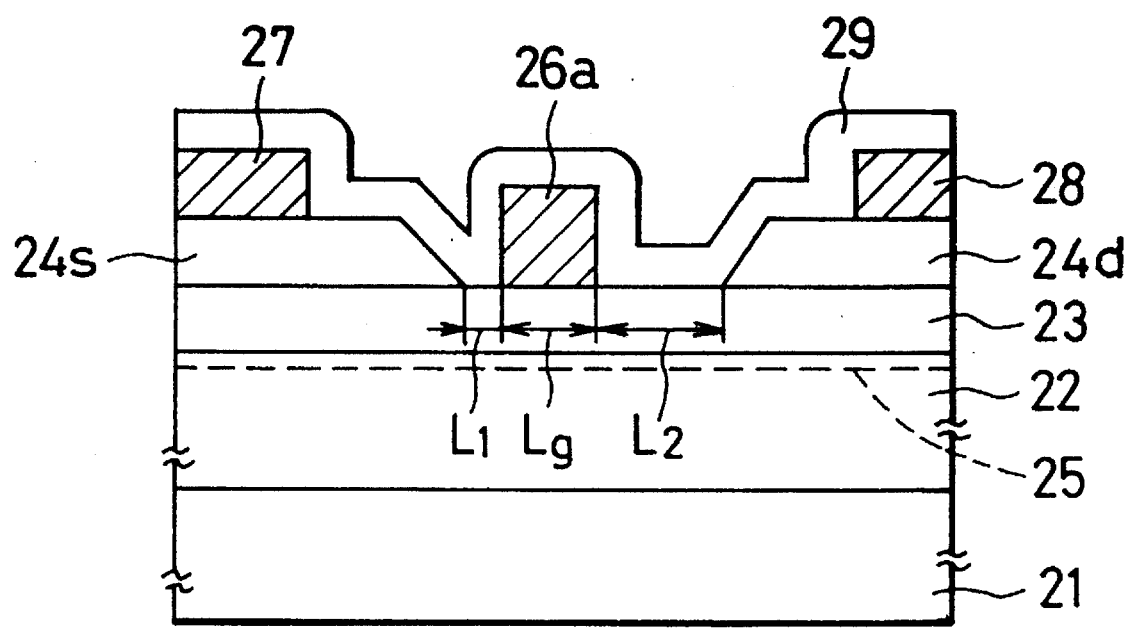

After stripping the photoresist layer 32 off, as shown in FIG. 9E, a passivation layer 29 made of $SiN_x$ is formed over the substrate 21, resulting in the FET of the third embodiment.

In the third embodiment, the distances $L_i$ and $L_2$ were set as 0.05 µm and 0.35 µm, respectively, and the distance $L_g$ was set as 0.2 µm. The thickness of the GaAs contact layer 24 was able to be controlled within the range of 50±0.5 nm due to an obtainable thickness accuracy or thickness controllability of the MBE process. The length $L_1$ was able to be controlled within the range of 0.05±0.005 µm if the etch rate of the contact layer 24 was set as about 5 nm/sec.

Also, because of no dependence on the registration accuracy of the lithography process, an obtainable series resistance $R_S$ per unit gate width was $0.4\pm0.05\Omega.\text{mm}$, which was improved by $0.2\Omega.\text{mm}$ in average compared with the conventional ones. Also, the variation or dispersion of the resistance $R_S$ was drastically improved.

Accordingly, also in the third embodiment, both the high-frequency noise characteristic of this FET and its dispersion were reduced, providing drastic improvement in fabrication yield.

Fourth Embodiment

A fabrication method of a GaAs heterojunction FET according to a fourth embodiment is shown in FIGS. 10A to 10E, which is equivalent to that of the third embodiment other than that an etch-stop layer is additionally provided between an n-type $Al_{0.25}Ga_{0.75}As$ electron-supply layer and an n-type GaAs contact layer.

Figure 10A:
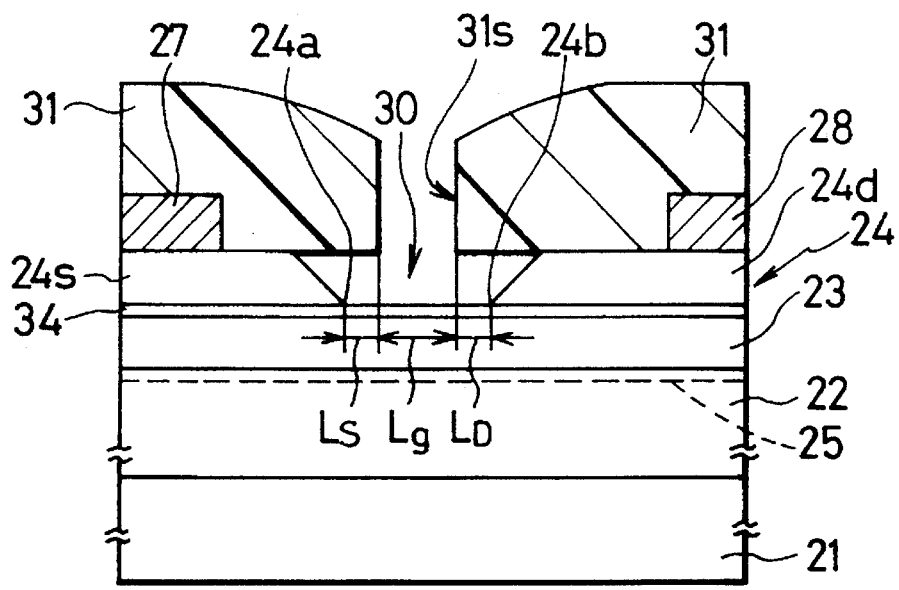
FIGS. 10A to 10E are cross-sectional views showing a fabrication method of a FET according to a fourth embodiment of the invention, respectively.

First, as shown in FIG. 10A, an undoped GaAs channel layer 22 with a thickness of 500 nm is epitaxially grown on a semi-insulating GaAs substrate 21. An n-type $Al_{0.25}Ga_{0.75}As$ electron-supply layer 23 with a thickness of 35 nm is epitaxially grown on the channel layer 22. The layer 23 is doped with Si, the doping concentration $N_D$ of which is $2\times10^{18}$ atoms/cm$^3$. An undoped $Al_{0.4}Ga_{0.6}As$ etch-stop layer 34 with a thickness of 3 nm is epitaxially grown on the electron-supply layer 23. An n-type GaAs contact layer 24 with a thickness of 50 nm is epitaxially grown on the etch-stop layer 34. The layer 24 is doped with Si, the doping concentration $N_D$ of which is $5\times10^{18}$ atoms/cm$^3$. These layers 22, 23, 34 and 24 are all grown by MBE processes.

The MBE processes are the same as those in the first embodiment.

Next, a AuGeNi alloy layer is formed on the contact layer 24 to be patterned by the same processes as those of the third embodiment, forming a source electrode 27 and a drain electrode 28, as shown in FIG. 10A. Then, the source and drain electrodes 27 and 28 are subject to heat-treatment for alloying with the GaAs contact layer 24 at their interfaces. Thus, the electrodes 27 and 28 become in Ohmic contact with the contact layer 24 with low resistances.

An EB resist layer 31 is formed on the contact layer 24 to cover the source and drain electrodes 27 and 28 and patterned by the same way as the third embodiment, forming a strip-like, penetrating window 31a in the layer 31 between the source and drain electrodes 27 and 28. Using the EB resist layer 31 thus patterned as a mask, the underlying contact layer 24 is selectively removed by a wet etching process instead of the RIE process for the third embodiment, producing a strip-like, symmetrical recess 30 on the etch-stop layer 34.

This wet etching process is carried out using the mixture of a 29-weight % water solution of ammonium hydroxide ($NH_4OH$) and a 30%-concentration water solution of $H_2O_2$, the mixture ratio ($NH_4OH/H_2O_2$) of which is 1/20 in volume. Thus, an etch rate of the GaAs contact layer 24 can become 200 times or more as much as that of the $Al_{0.4}Ga_{0.6}As$ etch-stop layer 34, in other words, the etch rate ratio (GaAs/$Al_{0.4}Ga_{0.6}As$) of which is 200/1 or more.

Through this wet etching process, as shown in FIG. 10A, both the distances $L_S$ and $L_D$ become 0.05 μm.

Because the etch rate ratio or selectivity ratio (GaAs/$Al_{0.25}Ga_{0.75}As$) is 200/1 or more, the underlying undoped $Al_{0.4}Ga_{0.6}As$ layer 34 is almost never etched during this process.

Figure 10B:
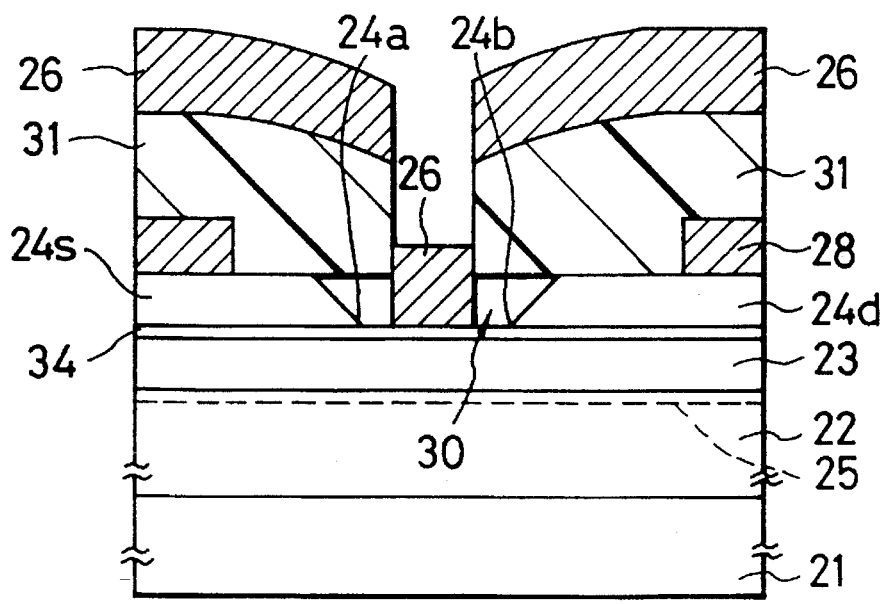
Figure 10C:
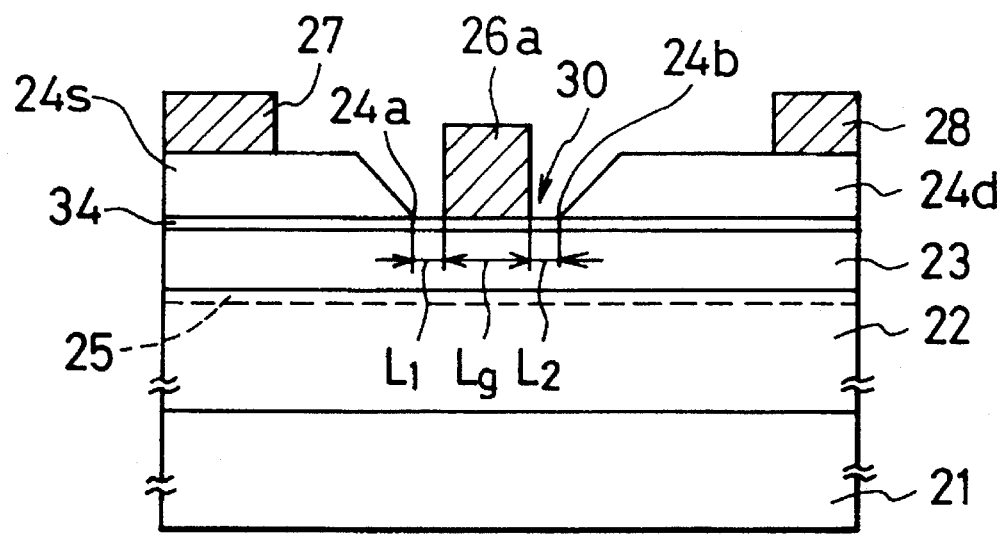
Figure 10D:
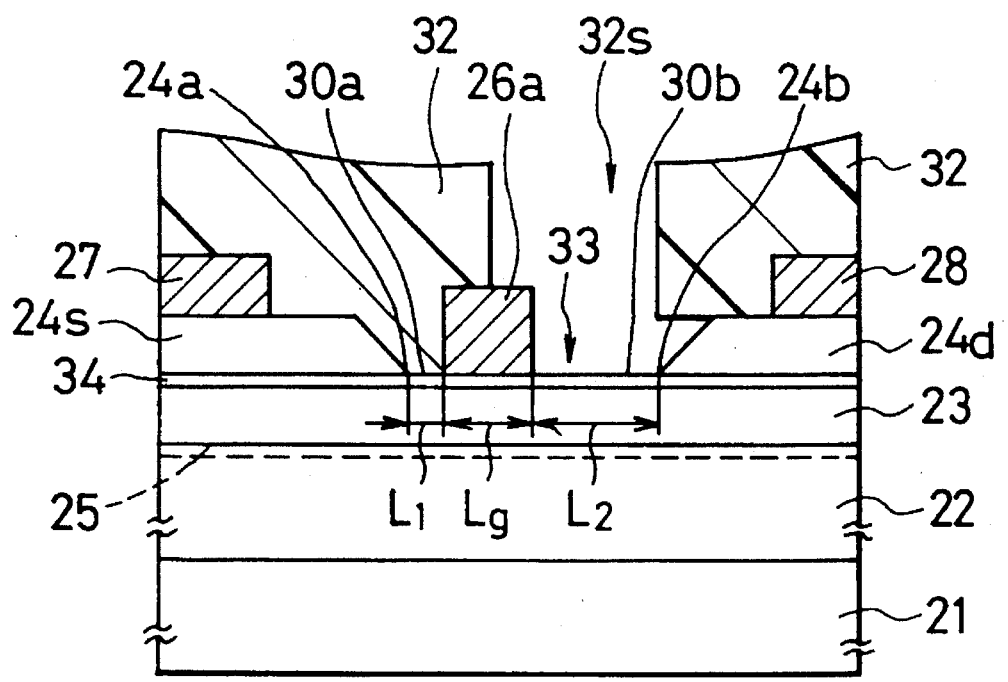

Subsequently, an Al layer 26 is formed on the resist layer 31 to cover the window 31s of the layer 31 by the same process as that of the third embodiment, as shown in FIG. 10B. The EB resist layer 31 is then stripped off by a lift off process so that the overlying Al layer 26 is selectively removed, leaving a strip-like part 26a acting as the gate electrode 26a in the recess 30, as shown in FIG. 10C.

A photoresist layer 32 is formed on the contact layer 24 to be patterned. Using the photoresist layer 32 thus patterned as a mask, the contact layer 24 is selectively etched again by the same wet etching process as used in forming the symmetrical recess 30. Thus, the uncovered drain-side end of the contact layer 24 is etched again so that an asymmetrical recess 33 is generated between the source-side and drain-side sections 24s and 24d of the layer 24.

The etching period of time is controlled so that the distance $L_2$ between the drain-side bottom edge 24b and the opposing edge of the gate electrode 26a becomes 0.35 μm.

Figure 10E:
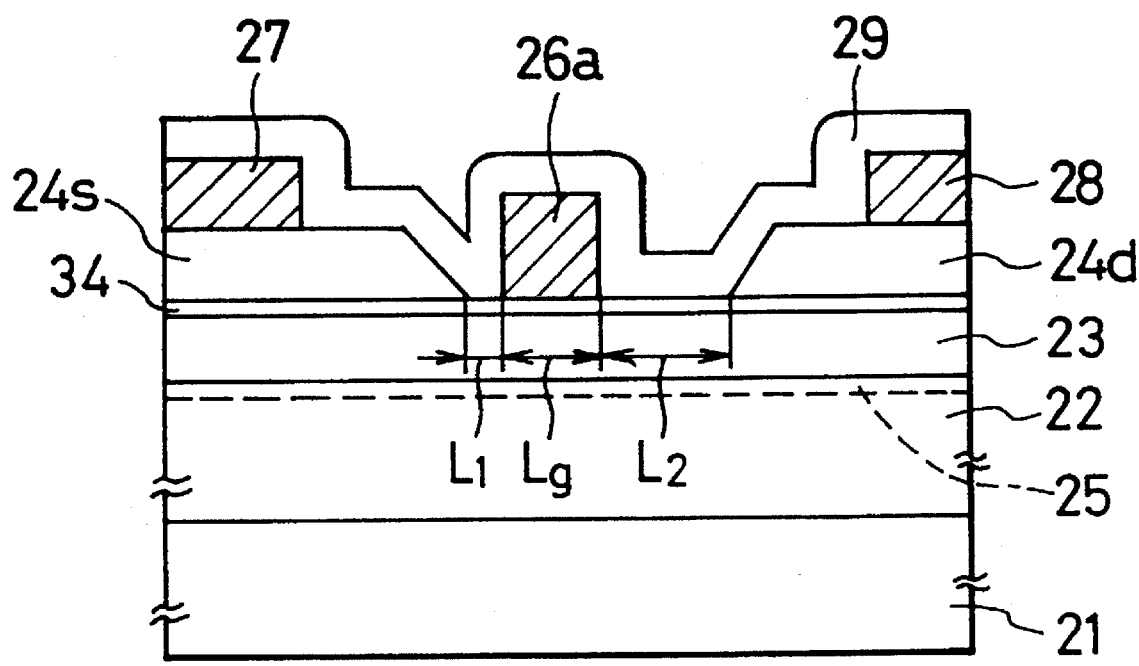

After stripping the photoresist layer 32 off, as shown in FIG. 10E, a passivation layer 29 made of $SiN_x$ is formed over the substrate 21, resulting in the FET of the fourth embodiment.

In the fourth embodiment, the distances $L_1$ and $L_2$ were set as 0.05 μm and 0.35 μm, respectively, and the distance $L_g$ was set as 0.2 μm. The thickness of the GaAs contact layer 24 was able to be controlled within the range of $50\pm0.5$ nm. The length $L_1$ was able to be controlled within the range of $0.05\pm0.005$ μm if the etch rate of the contact layer 24 was set as about 6 nm/sec.

Also, because of no dependence on the registration accuracy of the lithography process, an obtainable series resistance $R_s$ per unit gate width was $0.4\pm0.05\Omega.\text{mm}$, which was improved by $0.2\Omega.\text{mm}$ in average compared with the conventional ones. Also, the variation or dispersion of the resistance $R_S$ was drastically improved.

Accordingly, also in the fourth embodiment, both the high-frequency noise characteristic of this FET and its dispersion were reduced, providing drastic improvement in fabrication yield.

In the above embodiments, though $L_g=0.2$ μm, $L_1=0.1$ μm and $L_3=0.3$ μm, of course, any other values can be set. The epitaxial layers 2, 3, 19 and 4 are grown by MBE processes, respectively; however, any other epitaxial growth method may be employed.

Also, though each of the above FETs is of a GaAs-AlGaAs system, any other material may be used. For example, a semi-insulating InP substrate may be used instead of the semi-insulating GaAs substrate. An $In_zGa_{1-z}As$ (for example, z=0.53) layer may be used as the channel layer or contact layer. An $In_zAl_{1-z}As$ (for example, z=0.52) layer may be used as the carrier-supply layer or etch-stop layer.

During the wet etching processes, butanedioic acid may be used as an etching solution.

Though the electron-supply layers are shown in the embodiments, it is needless to say that a hole-supply layer may be used.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A fabrication method of a field-effect transistor having an asymmetrical recess structure, said method comprising the steps of:

(a) preparing a semiconductor substructure containing a semiconductor substrate, a first semiconductor layer formed on or over said substrate, and a second semiconductor layer formed on said first semiconductor layer;

(b) forming an insulator layer on said second semiconductor layer;

(c) patterning said insulator layer to produce a first window at a corresponding position to a gate electrode of said transistor, exposing said second semiconductor layer through said first window;

(d) selectively removing said second semiconductor layer using said insulator layer patterned as a mask by a first isotropically etching process in which an etch rate of said second semiconductor layer is higher than that of said first semiconductor layer so that said second semiconductor layer is divided into a first section and a second section, producing a symmetrical recess on said first semiconductor layer at a corresponding position to said first window, said first section having a first end and said second section having a second end opposite to said first end, and said first end and said second end being positioned symmetrically with respect to said first window;

(e) selectively removing said second end of said second section without removing said first end of said first section by a second isotropically etching process in which an etch rate of said second semiconductor layer is higher than that of said first semiconductor layer, so that an asymmetrical recess is produced from said symmetrical recess, said first section acting as a source electrode of said transistor and said second section acting as a drain electrode of said transistor;

(f) forming a conductor layer on said insulator layer patterned to be contacted with said first semiconductor layer through said first window at a bottom of said asymmetrical recess;

(g) selectively removing said conductor layer so that said conductor layer remains in said asymmetrical recess and said first window, said remaining conductor layer forming said gate electrode that is in Schottky contact with said first semiconductor layer; and (h) removing said insulator layer patterned from said second semiconductor layer after said step (g);

wherein a source-side bottom length of said recess between source-side bottom edge of said recess and an opposite bottom edge of said gate electrode is longer than a drain-side bottom length thereof between a drain-side edge of said recess and an opposite bottom edge of said gate electrode, forming said asymmetrical recess structure.

2. A method as claimed in claim 1, wherein said substrate is a semi-insulating GaAs substrate, said first semiconductor layer is an n-type $Al_xGa_{1-x}As$ layer for supplying electrons where $0<x<1$, and said second semiconductor layer is an n-type GaAs layer.

3. A fabrication method of a field-effect transistor having an asymmetrical recess structure, said method comprising the steps of:

(a) preparing a semiconductor substructure containing a semiconductor substrate, a first semiconductor layer formed over said substrate, a semiconductor etch-stop layer formed on said first semiconductor layer, and a second semiconductor layer formed on said semiconductor etch-stop layer;

(b) forming an insulator layer on said second semiconductor layer;

(c) patterning said insulator layer to produce a first window at a corresponding position to a gate electrode of said transistor, exposing said second semiconductor layer through said first window;

(d) selectively removing said second semiconductor layer using said insulator layer patterned as a mask by a first isotropically etching process in which an etch rate of said second semiconductor layer is higher than that of said semiconductor etch-stop layer so that said second semiconductor layer is divided into a first section and a second section, producing a symmetrical recess on said semiconductor etch-stop layer at a corresponding position to said first window, said first section having a first end and said second section having a second end opposite to said first end, and said first end and said second end being positioned symmetrically with respect to said first window;

(e) selectively removing said second end of said second section without removing said first end of said first section by a second isotropically etching process in which an etch rate of said second semiconductor layer is higher than that of said semiconductor etch-stop layer, so that an asymmetrical recess is produced from said symmetrical recess, said first section acting as a source electrode of said transistor and said second section acting as a drain electrode of said transistor;

(f) forming a conductor layer on said insulator layer patterned to be contacted with said first semiconductor layer through said first window at a bottom of said asymmetrical recess;

(g) selectively removing said conductor layer so that said conductor layer remains in said asymmetrical recess and said first window, said remaining conductor layer forming said gate electrode that is in Schottky contact with said semiconductor etch-stop layer; and (h) removing said insulator layer patterned from said second semiconductor layer after said step (g);

wherein a source-side bottom length of said recess between source-side bottom edge of said recess and an opposite bottom edge of said gate electrode is longer than a drain-side bottom length thereof between a drain-side edge of said recess and an opposite bottom edge of said gate electrode, forming said asymmetrical recess structure.

4. A method as claimed in claim 3, wherein said substrate is a semi-insulating GaAs substrate, said first semiconductor layer is an n-type GaAs layer, said second semiconductor layer is an n-type $Al_xGa_{1-x}As$ layer for supplying electrons, and said etch-stop layer is an $Al_yGa_{1-y}As$ layer, where $0<x<y<1$.

5. A fabrication method of a field-effect transistor having an asymmetrical recess structure, said method comprising the steps of:

(a) preparing a semiconductor substructure containing a semiconductor substrate, a first semiconductor layer formed over said substrate, and a second semiconductor layer formed on said first semiconductor layer;

(b) forming a source electrode and a drain electrode of said transistor on said second semiconductor layer;

(c) forming a resist layer on said second semiconductor layer to cover said source electrode and said drain electrode;

(d) patterning said resist layer to produce a first window at a corresponding position to a gate electrode of said transistor, exposing said second semiconductor layer through said first window;

(e) selectively removing said second semiconductor layer using said resist layer patterned as a mask by a first etching process in which an etch rate of said second semiconductor layer is higher than that of said first semiconductor layer, so that said second semiconductor layer is divided into a first section and a second section, producing a symmetrical recess on said first semiconductor layer at a corresponding position to said first window, said first section having a first end and said second section having a second end opposite to said first window, and said first end and said second end being positioned symmetrically with respect to said first window;

(f) forming a conductor layer on said resist layer patterned to be contacted with said first semiconductor layer through said first window at a bottom of said symmetrical recess;

(g) selectively removing said conductor layer so that said conductor layer remains in said symmetrical recess, said remaining conductor layer forming said gate electrode that is in Schottky contact with said first semiconductor layer;

(h) removing said resist layer patterned from said second semiconductor layer after said step (g); and (i) selectively removing said second end of said second section without removing said first end of said first section by a second etching process in which an etch rate of said second semiconductor layer is higher than that of said first semiconductor layer, so that an asymmetrical recess is produced from said symmetrical recess;

wherein a source-side bottom length of said recess between source-side bottom edge of said recess and an opposite bottom edge of said gate electrode is longer than a drain-side bottom length thereof between a drain-side edge of said recess and an opposite bottom edge of said gate electrode, forming said asymmetrical recess structure.

6. A method as claimed in claim 5, wherein said substrate is a semi-insulating GaAs substrate, said first semiconductor layer is an n-type GaAs layer, said second semiconductor layer is an n-type $Al_xGa_{1-x}As$ layer for supplying electrons where $0<x<1$.

7. A fabrication method of a field-effect transistor having an asymmetrical recess structure, said method comprising the steps of:

(a) preparing a semiconductor substructure containing a semiconductor substrate, a first semiconductor layer formed over said substrate, a semiconductor etch-stop layer formed on said first semiconductor layer, and a second semiconductor layer formed on said semiconductor etch-stop layer;

(b) forming a source electrode and a drain electrode of said transistor on said second semiconductor layer;

(c) forming a resist layer on said second semiconductor layer to cover said source electrode and said drain electrode;

(d) patterning said resist layer to produce a first window at a corresponding position to a gate electrode of said transistor, exposing said second semiconductor layer through said first window;

(e) selectively removing said second semiconductor layer using said resist layer patterned as a mask by a first etching process in which an etch rate of said second semiconductor layer is higher than that of said semiconductor etch-stop layer, so that said second semiconductor layer is divided into a first section and a second section, producing a symmetrical recess on said semiconductor etch-stop layer at a corresponding position to said first window, said first section having a first end and said second section having a second end opposite to said first window, and said first end and said second end being positioned symmetrically with respect to said first window;

(f) forming a conductor layer on said resist layer patterned to be contacted with said semiconductor etch-stop layer through said first window at a bottom of said symmetrical recess;

(g) selectively removing said conductor layer so that said conductor layer remains in said symmetrical recess, said remaining conductor layer forming said gate electrode that is in Schottky contact with said semiconductor etch-stop layer;

(h) removing said resist layer patterned from said second semiconductor layer after said step (g); and (i) selectively removing said second end of said second section without removing said first end of said first section by a second etching process in which an etch rate of said second semiconductor layer is higher than that of said semiconductor etch-stop layer, so that an asymmetrical recess is produced from said symmetrical recess;

wherein a source-side bottom length of said recess between source-side bottom edge of said recess and an opposite bottom edge of said gate electrode is longer than a drain-side bottom length thereof between a drain-side edge of said recess and an opposite bottom edge of said gate electrode, forming said asymmetrical recess structure.

8. A method as claimed in claim 7, wherein said substrate is a semi-insulating GaAs substrate, said second semiconductor layer is an n-type GaAs layer, said first semiconductor layer is an n-type $Al_xGa_{1-x}As$ layer for supplying electrons, and said semiconductor etch-stop layer is an n-type $Al_yGa_{1-y}As$ layer, where $0<x<y<1$.

9. A fabrication method of a field-effect transistor having an asymmetrical recess structure, said method comprising the steps of:

(a) epitaxially growing a semiconductor channel layer on a semiconductor substrate;

(b) epitaxially growing a semiconductor carrier-supply layer on said channel layer;

(c) epitaxially growing a semiconductor contact layer on said carrier-supply layer;

(d) forming an insulator layer on said contact layer;

(e) patterning said insulator layer to produce a first window passing through said insulator layer at a position corresponding to a gate electrode of said field-effect transistor, exposing a surface of said contact layer through said first window;

(f) selectively removing said contact layer using said patterned insulator layer as a mask by an isotropically etching process in which an etch rate of said contact layer is higher than that of said carrier-supply layer, so that a recess is formed on said carrier-supply layer at a position corresponding to said first window, said contact layer being divided into first and second sections by said recess and having opposing first and second ends positioned symmetrically with respect to said first window;

(g) selectively removing said second end of said contact layer without removing said first end of said contact layer by an isotropically etching process in which an etch rate of said contact layer is higher than that of said carrier-supply layer, said contact layer thus etched forming a source contact and a drain contact of said field-effect transistor at each side of said recess;

(h) forming a conductor layer on said patterned insulator layer, said conductor layer being contacted with said carrier-supply layer in said asymmetrical recess through said first window;

(i) patterning said conductor layer to form said gate electrode, said gate electrode being in Schottky contact with said carrier-supply layer;

(j) removing said insulator layer from said contact layer after said step of (i); and (k) forming a source electrode and a drain electrode on said first section and said second section of said contact layer, respectively;

wherein a distance between said second end of said contact layer and said gate electrode is longer than a distance between said first end of said contact layer and said gate electrode, forming said asymmetrical recess structure.

10. A method as claimed in claim 9, wherein said substrate is a semi-insulating GaAs substrate, said channel layer is a GaAs layer, said carrier-supply layer is an n-type $Al_xGa_{1-x}As$ layer for supplying electrons where $0<x<1$, and said contact layer is an n-type GaAs layer.

11. A fabrication method of a field-effect transistor having an asymmetrical recess structure, said method comprising the steps of:

(a) epitaxially growing a semiconductor channel layer on a semiconductor substrate;

(b) epitaxially growing a semiconductor carrier-supply layer on said channel layer;

(c) epitaxially growing a semiconductor etch-stop layer on said carrier-supply layer;

(d) epitaxially growing a semiconductor contact layer on said etch-stop layer;

(e) forming an insulator layer on said contact layer;

(f) patterning said insulator layer to produce a first window passing through said insulator layer at a position corresponding to a gate electrode of said field-effect transistor, exposing a surface of said contact layer through said first window;

(g) selectively removing said contact layer using said patterned insulator layer as a mask by an isotropically etching process in which an etch rate of said contact layer is higher than that of said etch-stop layer, so that a recess is formed on said etch-stop layer at a position corresponding to said first window, said contact layer being divided into first and second sections by said recess and having opposing first and second ends positioned symmetrically with respect to said first window;

(h) selectively removing said second end of said contact layer without removing said first end of said contact layer by an isotropically etching process in which an etch rate of said contact layer is higher than that of said etch-stop layer, said contact layer thus etched forming a source contact and a drain contact of said field-effect transistor at each side of said recess;

(i) forming a conductor layer on said patterned insulator layer, said conductor layer being contacted with said etch-stop layer in said recess through said first window;

(j) patterning said conductor layer to form a gate electrode of said field-effect transistor, said gate electrode being in Schottky contact with said etch-stop layer;

(k) removing said insulator layer from said contact layer after said step of (i); and (l) forming a source electrode and a drain electrode on said first section and said second section of said contact layer, respectively;

wherein a distance between said second end of said contact layer and said gate electrode is longer than a distance between said first end of said contact layer and said gate electrode, forming said asymmetrical recess structure.

12. A method as claimed in claim 11, wherein said substrate is a semi-insulating GaAs substrate, said channel layer is a GaAs layer, said carrier-supply layer is an n-type $Al_xGa_{1-x}As$ layer for supplying electrons, said etch-stop layer is an $Al_yGa_{1-y}As$ layer where $0<x<y<1$, and said contact layer is an n-type GaAs layer.

13. A fabrication method of a field-effect transistor having an asymmetrical recess structure, said method comprising the steps of:

(a) epitaxially growing a semiconductor channel layer on a semiconductor substrate;

(b) epitaxially growing a semiconductor carrier-supply layer on said channel layer;

(c) epitaxially growing a semiconductor contact layer on said carrier-supply layer;

(d) forming a source electrode and a drain electrode of said field-effect transistor on said contact layer, said source electrode and said drain electrode being in Ohmic contact with said contact layer;

(e) forming a resist film on said contact layer to cover said source electrode and said drain electrode;

(f) patterning said resist film to produce a first window passing through said resist film at a position corresponding to a gate electrode of said field-effect transistor, exposing a surface of said contact layer through said first window;

(g) selectively removing said contact layer using said patterned resist film as a mask by an isotropically etching process in which an etch rate of said contact layer is higher than that of said carrier-supply layer, so that a recess is formed on said carrier-supply layer at a position corresponding to said first window, said contact layer being divided into first and second sections by said recess and having opposing first and second ends positioned symmetrically with respect to said first window;

(h) forming a conductor layer on said patterned resist film, said conductor layer being contacted with said carrier-supply layer in said recess through said first window;

(i) patterning said conductor layer to form said gate electrode, said gate electrode being in Schottky contact with said carrier-supply layer;

(j) removing said resist film from said contact layer after said step of (i); and (h) selectively removing said second end of said contact layer without removing said first end of said contact layer by an isotropically etching process in which an etch rate of said contact layer is higher than that of said carrier-supply layer;

wherein a distance between said second end of said contact layer and said gate electrode is longer than a distance between said first end of said contact layer and said gate electrode, forming said asymmetrical recess structure.

14. A method as claimed in claim 13, wherein said substrate is a semi-insulating GaAs substrate, said channel layer is a GaAs layer, said carrier-supply layer is an n-type $Al_xGa_{1-x}As$ layer for supplying electrons where $0<x<1$, and said contact layer is an n-type GaAs layer.

15. A fabrication method of a field-effect transistor having an asymmetrical recess structure, said method comprising the steps of:

(a) epitaxially growing a semiconductor channel layer on a semiconductor substrate;

(b) epitaxially growing a semiconductor carrier-supply layer on said channel layer;

(c) epitaxially growing a semiconductor etch-stop layer on said carrier-supply layer;

(d) epitaxially growing a semiconductor contact layer on said etch-stop layer;

(e) forming a source electrode and a drain electrode of said field-effect transistor on said contact layer, said source electrode and said drain electrode being in Ohmic contact with said contact layer;

(f) forming a resist film on said contact layer to cover said source electrode and said drain electrode;

(g) patterning said resist film to produce a first window passing through said resist film at a position corresponding to a gate electrode of said field-effect transistor, exposing a surface of said etch-stop layer through said first window;

(h) selectively removing said contact layer using said patterned resist film as a mask by an isotropically etching process in which an etch rate of said contact layer is higher than that of said etch-stop layer, so that a recess is formed on said etch-stop layer at a position corresponding to said first window, said contact layer being divided into first and second sections by said recess and having opposing first and second ends positioned symmetrically with respect to said first window;

(i) forming a conductor layer on said patterned resist film, said conductor layer being contacted with said etch-stop layer in said recess through said first window;

(j) patterning said conductor layer to form said gate electrode, said gate electrode being in Schottky contact with said carrier-supply layer;

(k) removing said resist film from said contact layer after said step of (i); and (l) selectively removing said second end of said contact layer without removing said first end of said contact layer by an isotropically etching process in which an etch rate of said contact layer is higher than that of said carrier-supply layer;

wherein a distance between said second end of said contact layer and said gate electrode is longer than a distance between said first end of said contact layer and said gate electrode, forming said asymmetrical recess structure.

16. A method as claimed in claim 15, wherein said substrate is a semi-insulating GaAs substrate, said channel layer is a GaAs layer, said carrier-supply layer is an n-type $Al_xGa_{1-x}As$ layer for supplying electrons where $0<x<1$, and said contact layer is an n-type GaAs layer.

* * * * *